United States Patent [19]

Farrell et al.

[11] Patent Number: 5,519,345
[45] Date of Patent: May 21, 1996

[54] RECONFIGURABLE INTERRUPT DEVICE AND METHOD

[75] Inventors: Robert Farrell, Hillsborough, N.J.; Himanshu Sanghavi, Chandler; Ashish Pandya, Phoenix, both of Ariz.

[73] Assignee: Intel Corporation, Santa Clara, Calif.

[21] Appl. No.: 378,920

[22] Filed: Jan. 26, 1995

Related U.S. Application Data

[63] Continuation of Ser. No. 161,056, Dec. 2, 1993, abandoned, which is a continuation of Ser. No. 50,700, Apr. 21, 1993, abandoned.

[51] Int. Cl.$^6$ .................. H03K 19/0175; H03K 19/20
[52] U.S. Cl. .................. 327/108; 327/185; 326/56
[58] Field of Search .................. 307/443, 296.1, 307/271, 640, 241, 465; 328/63, 105; 395/225; 326/56, 59, 62; 327/407, 403, 488, 489, 108, 185, 333, 319, 306, 141, 185

[56] References Cited

U.S. PATENT DOCUMENTS

| | | | |
|---|---|---|---|
| 4,490,631 | 12/1984 | Kung | 326/56 |
| 4,808,938 | 2/1989 | Levinson | 307/241 |
| 5,107,230 | 4/1992 | King | 326/56 |
| 5,162,672 | 11/1992 | McMahan et al. | 307/241 |
| 5,179,704 | 1/1993 | Jibbe et al. | 395/725 |
| 5,201,051 | 4/1993 | Koide | 395/225 |
| 5,291,080 | 3/1994 | Amagasaki | 307/443 |
| 5,361,005 | 11/1994 | Slattery et al. | 326/56 |

Primary Examiner—Timothy P. Callahan
Assistant Examiner—Dinh T. Le
Attorney, Agent, or Firm—William H. Murray; N. Stephan Kinsella

[57] ABSTRACT

Reconfigurable interrupt circuitry may provide differing interrupt output signals to various interrupt receiving devices which are adapted to be driven by interrupt circuits having differing drive characteristics. Control signals representative of the device characteristics of the interrupt receiving device are applied to the reconfigurable interrupt circuitry and output characteristics of the reconfigurable interrupt circuitry are selected according to the control signals. In this manner the reconfigurable interrupt circuitry may by adapted to drive interrupt receiving devices which are compatible with active high interrupt output, active low interrupt output, open drain interrupt output, totem pole interrupt output, tristate interrupt output and non tristate interrupt output. The selected configuration of the reconfigurable interrupt circuitry is determined by writing to registers which may be placed within the memory space of external devices so that the external devices may configure the interrupt according to their own characteristics.

11 Claims, 14 Drawing Sheets

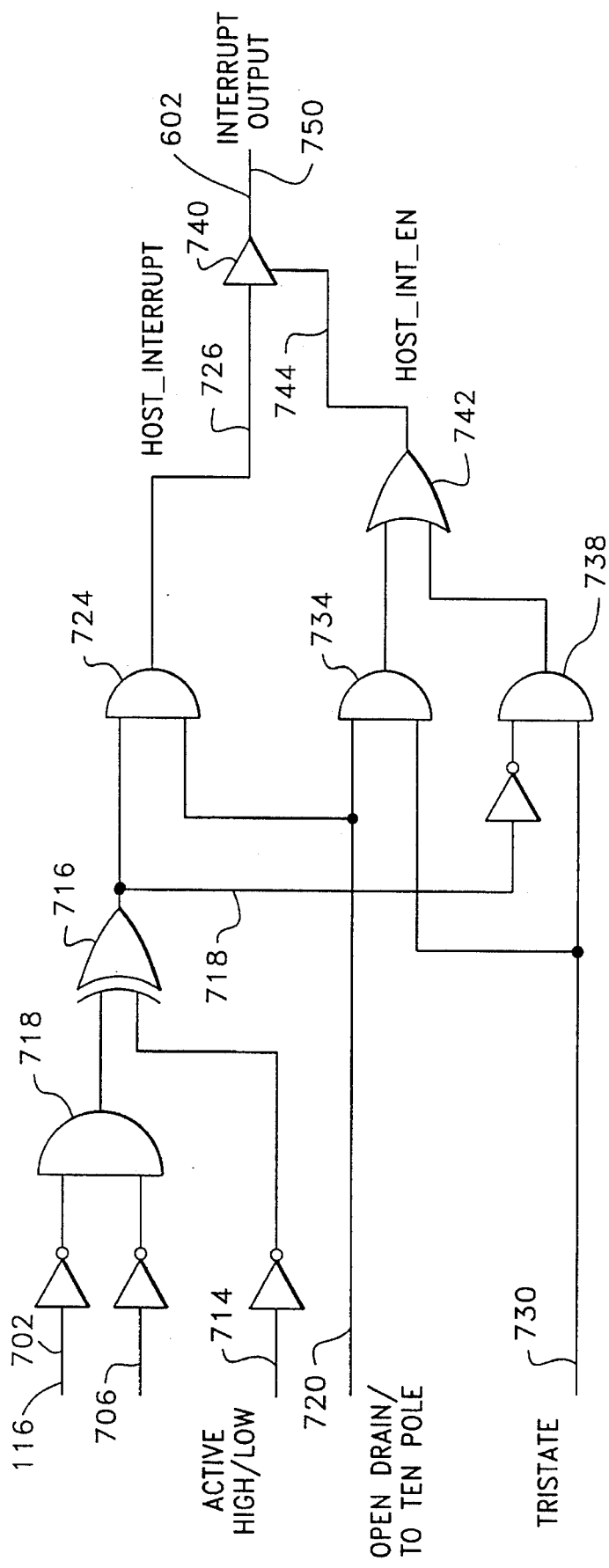
*FIG. 7A*
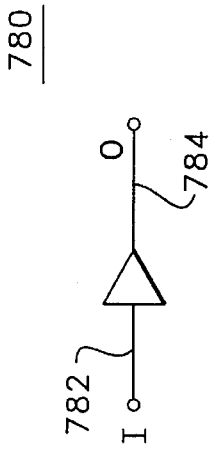
*FIG. 7D*
*FIG. 7C*
*FIG. 7B*

RECONFIGURABLE INTERRUPT DEVICE AND METHOD

This is a continuation of application Ser. No. 08/161,056 filed on 12/02/93, and now abandoned which is a continuation of application Ser. No. 08/060,700 filed 4/21/93 and now abandoned.

BACKGROUND OF THE INVENTION

1. Field of the Invention

This invention relates to the field of video processing and in particular to an integrated video processing system.

2. Background Art

In known digital video processing systems, it is conventional to store words on both word boundaries and on half word boundaries. Some devices within the system may be compatible with word boundary alignments while other devices may be compatible with half word alignments. Therefore, it is often necessary to swap half words in order to make one type of device compatible with another.

It is known to determine, for example by means of the video processor itself, the expected alignment of data and the actual alignment of data. The video processor may then perform a swap as required according to these determinations. However, this process uses video processor capability which may be better used elsewhere in the video processor system.

It is also known for several different devices within a video processor system to provide interrupt output signals to other devices in the system. Some of these interrupt output signals are active high and some are active low. Additionally, some are driven with open drain output devices and some are driven with totem pole output devices. Some of these output devices are tristate and some are non-tristate.

The interrupt receiving devices of these video processor systems are normally adapted to receive interrupt output signals only from devices having predetermined output characteristics. Thus, for example, a device which is compatible with active high interrupts will not operate properly if provided with interrupts that are active low. This type of incompatibility also arises with respect to open drain outputs and totem pole outputs as well as tristate and non-tristate outputs. Therefore, devices which are not compatible for these reasons must be interfaced. This requires extra hardware in order to receive the interrupt output signal of one device and provide, in response to this received signal, an interrupt output signal which may be applied to and used by the interrupt receiving device.

Within conventional digital video processors it is known to clock different elements within the video processor at different clock rates. Therefore, a received clock signal may be divided down to provide a clock signal having a different clock rate. Because the clock signal provided in this manner is a divided down clock signal it does not matter under normal circumstances what its phase may be with respect to the received clock. Furthermore, this divided down clock is strictly an internal clock and is not available external to the video processor. Therefore, the divided down clock may normally operate at a random phase with respect to the received clock. However, the existence of a clock at an unknown phase with respect to the internal clock may, in certain circumstances, make testability of certain operations of the digital video processor more difficult.

When access to a page of memory is complete and access to a different page is begun, the completed page must be closed and the new page must be opened. It is well known to those skilled in the art that the time for a video processing system to obtain access to a page of memory which is not open exceeds the access time required for access to the same page if the page is open. Furthermore, the access time required to access a different page of memory when a current page is open is even longer. Therefore, it would be more efficient to know whether the next access is in the same page in order to determine whether to close the current page when the system accesses memory VRAM.

SUMMARY OF THE INVENTION

Reconfigurable interrupt circuitry may provide differing interrupt output signals to various interrupt receiving devices which are adapted to be driven by interrupt circuits having differing drive characteristics. Control signals representative of the device characteristics of the interrupt receiving device are applied to the reconfigurable interrupt circuitry and output characteristics of the reconfigurable interrupt circuitry are selected according to the control signals. In this manner the reconfigurable interrupt circuitry may be adapted to drive interrupt receiving devices which are compatible with active high interrupt output, active low interrupt output, open drain interrupt output, totem pole interrupt output, tristate interrupt output and non-tristate interrupt output. The selected configuration of the reconfigurable interrupt circuitry is determined by writing to registers which may be placed within the memory space of external devices so that the external devices may configure the interrupt according to their own characteristics.

BRIEF DESCRIPTION OF THE DRAWINGS

FIG. 7A shows a schematic representation of a system for reconfiguring the interrupts of the integrated video processing system of FIG. 1.

FIGS. 7B–D show schematic representations of differing effective output configurations of the reconfigurable interrupt system of FIG. 7A.

DETAILED DESCRIPTION OF THE INVENTION

Figure 1A:
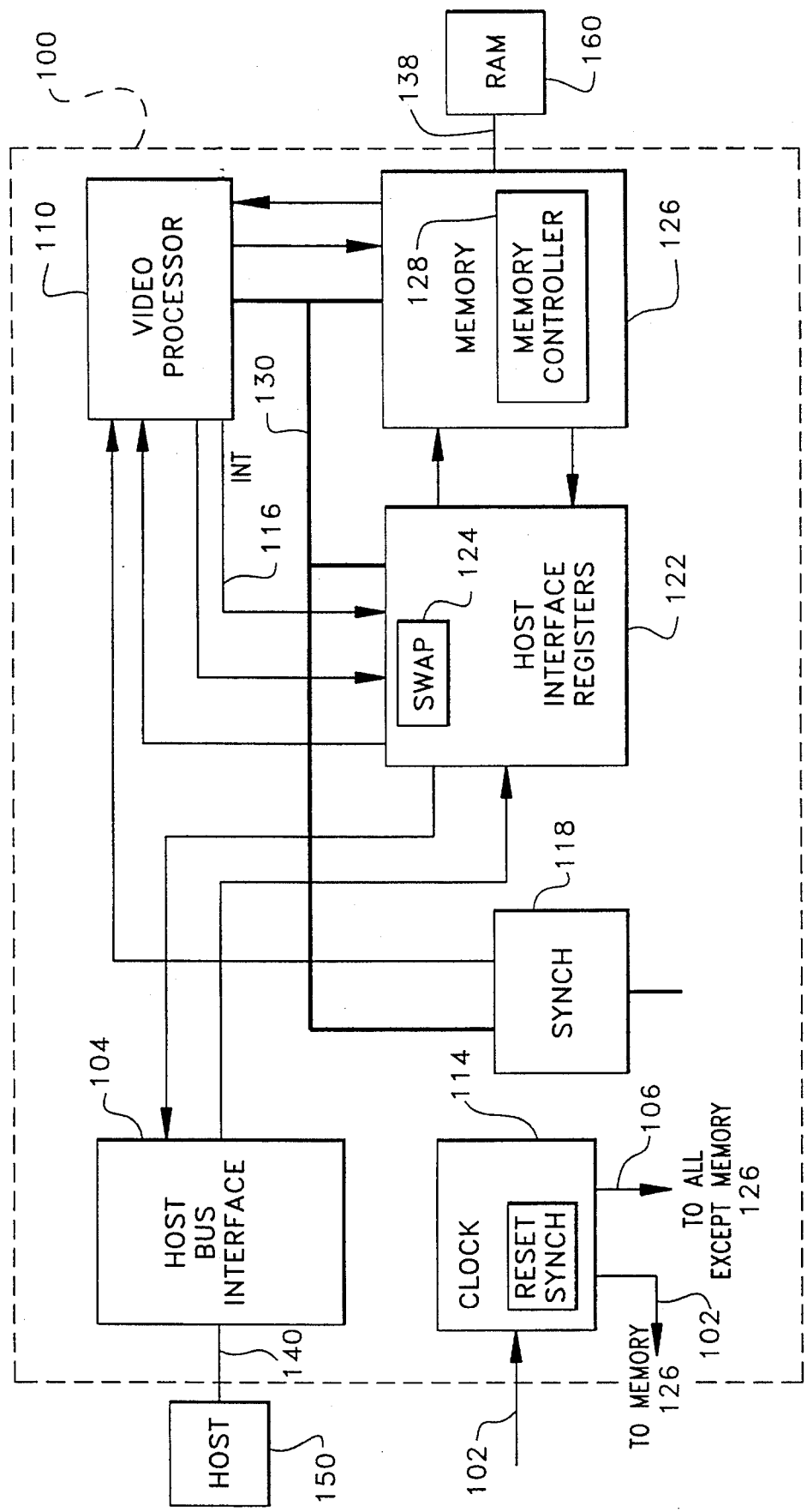
FIGS. 1A,B show a block diagram representation of the integrated video processing system of the present invention along with a computer system environment in which it may be used.
Figure 1B:
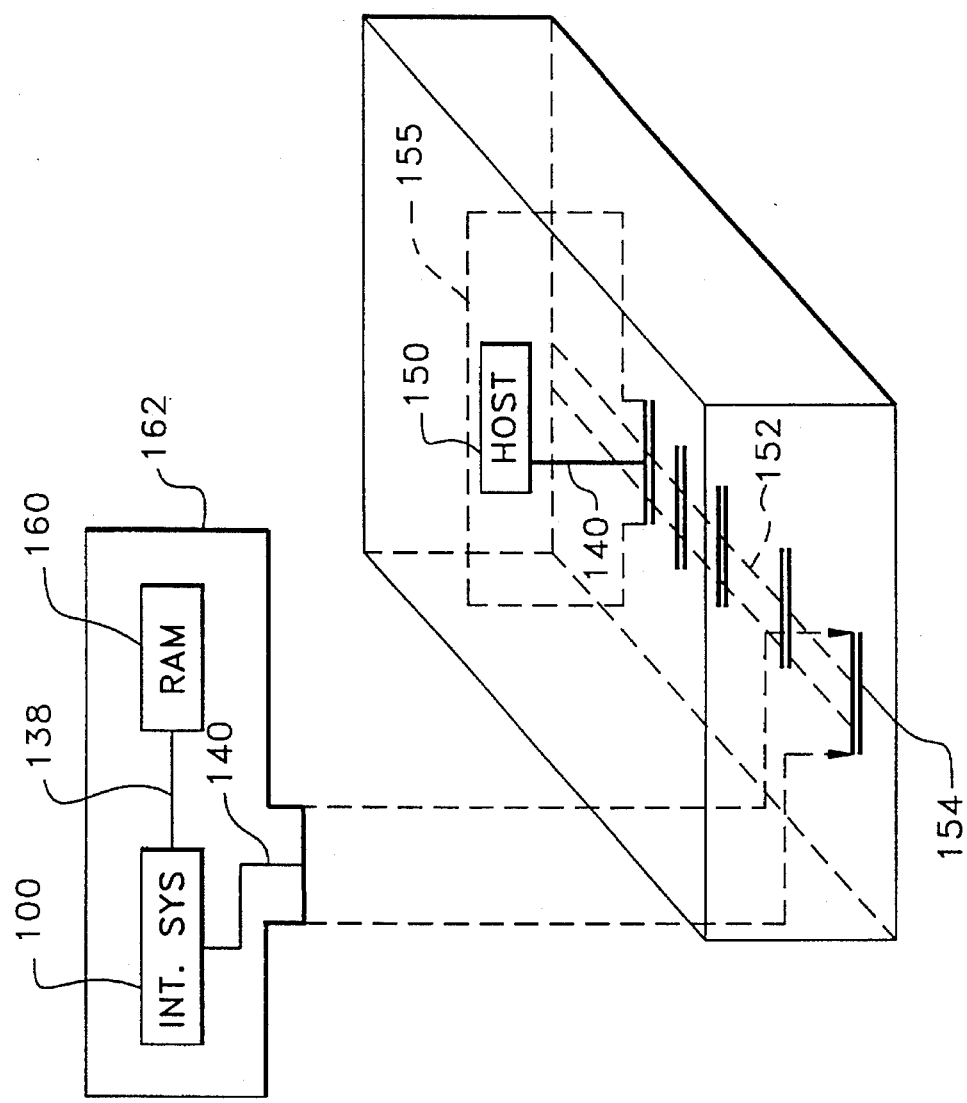

Referring now to FIGS. 1A,B, there is shown integrated video processing system 100 along with a computer system environment in which integrated video processing system 100 may be used. Integrated video processing system 100 includes digital video processor 110 for processing video signals applied to video processing system 100, host computer 150, bus interface 104 for interfacing video processing system 100 to host computer 150, synchronizer 118 containing several serial input/output communication channels for interfacing system 100 with other integrated circuits, host interface registers 122 for interfacing video processor 110 with external memory, video memory 126 for use by video processor 110 and clock circuitry 114. Video memory 126 of video processing system 100 may be coupled to external RAM 160 by way of bus 138. Clock circuitry 114 is provided with reset synchronization circuitry 112 for synchronizing the phase of divided-down clock signals within integrated video processing system 100.

Integrated video processing system 100 may be coupled to external RAM 160, by way of memory 126 and bus 138, and disposed upon printed circuit board 162. Additionally, host bus 140 of system 100, which is coupled to host bus interface 104, may be coupled to host computer 150. In order to couple integrated video processing system 100 to host computer 150 by way of host bus 140, printed circuit board 162 may be inserted into slot 154 of back plane 152. Also inserted into back plane 152 is printed circuit board 155 upon which host computer 150 is disposed.

Figure 2:
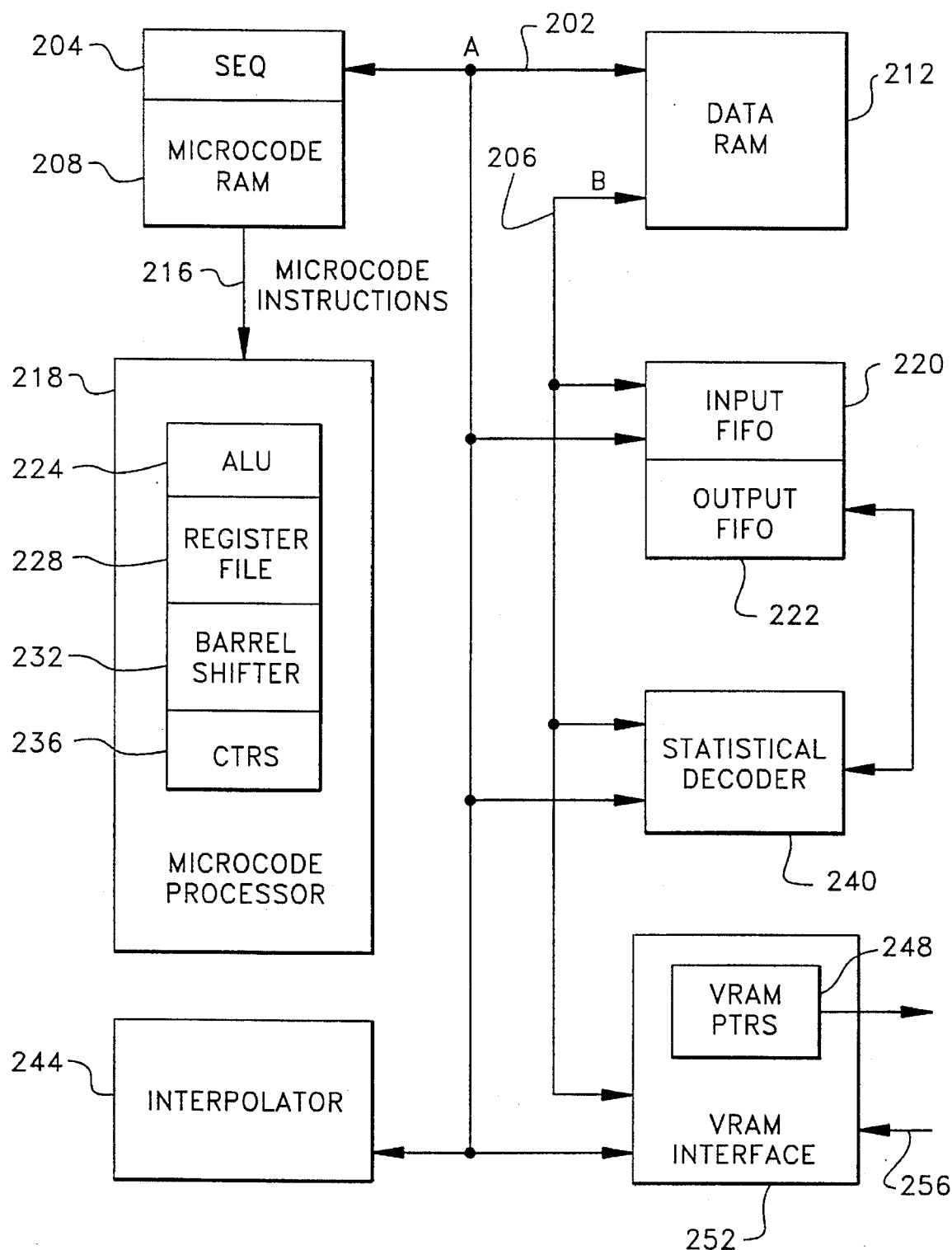
FIG. 2 shows a block diagram representation of the digital video processor of the video processing system of FIG. 1.
Figure 3A:
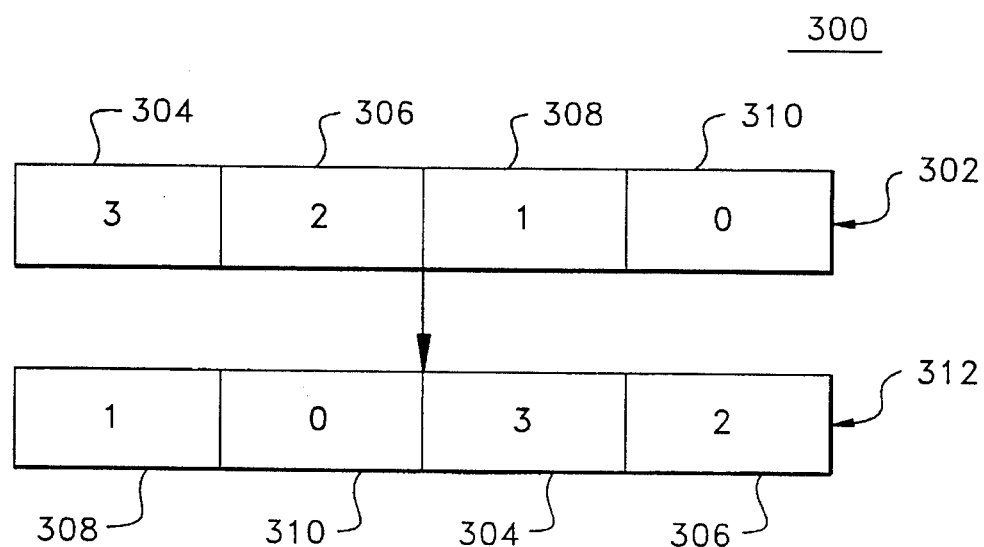
FIG. 3A shows a block diagram representation of the byte swapping operations performed by the digital video processor of FIG. 2.
Figure 3C:
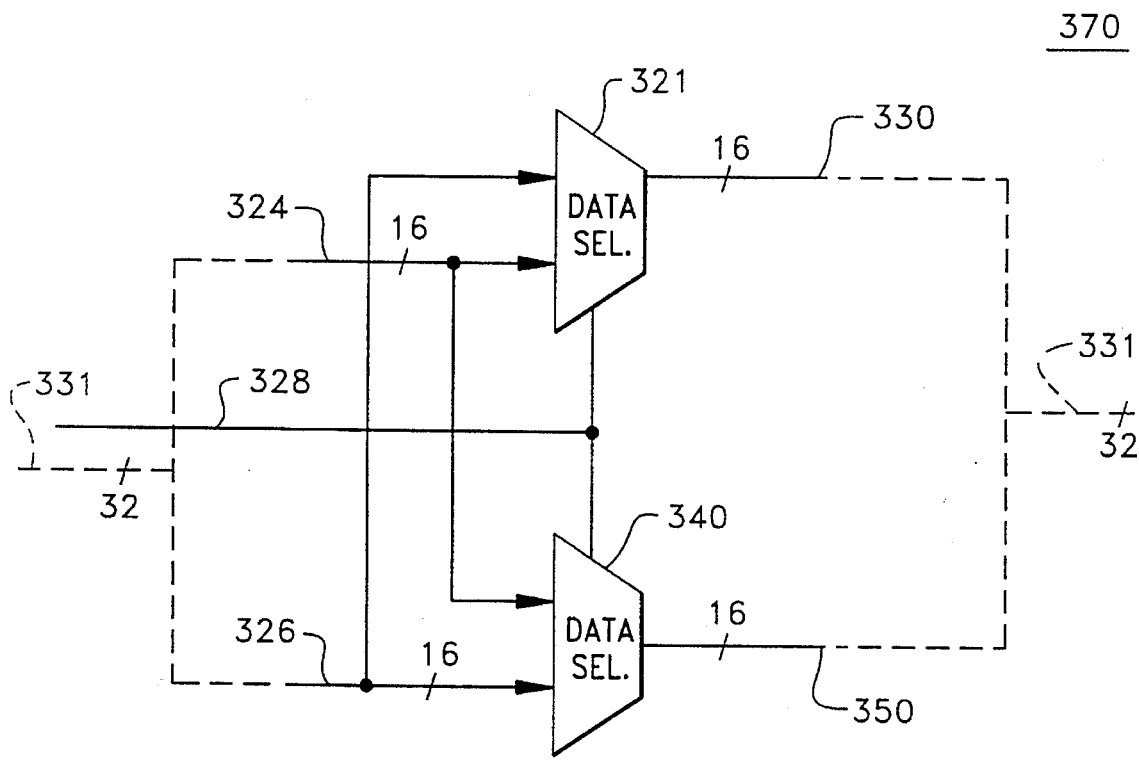
FIGS. 3B–D show block diagram representations of data alignment devices for performing the byte swapping operations of FIG. 3A.
Figure 3B:
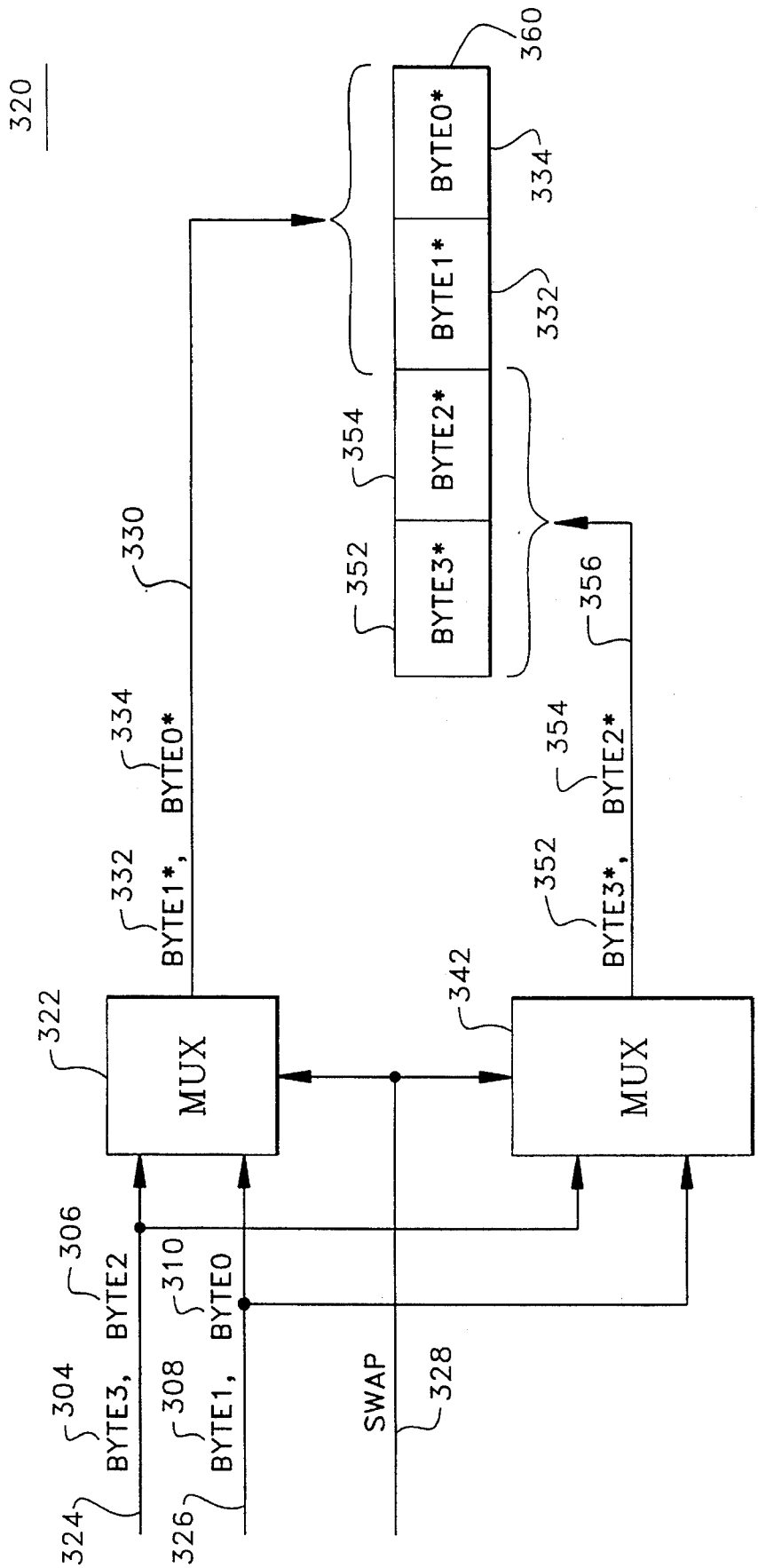
Figure 3D:
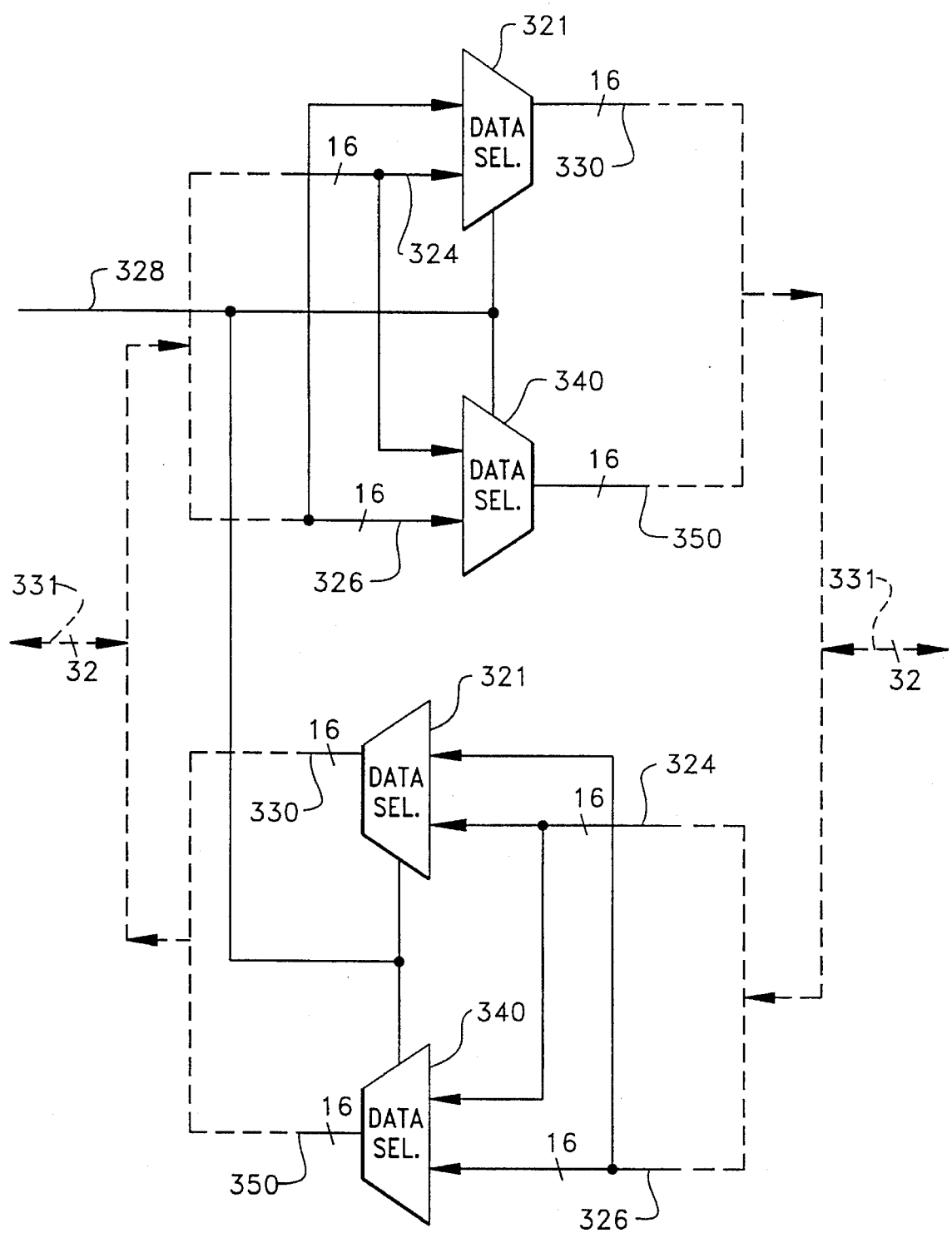

Referring now to FIG. 2, there is shown a more detailed representation of the architecture of digital video processor 110 of integrated video processing system 100. Within digital video processor 110 microcode routines residing in microcode RAM 208 may be executed by microcode processor 218 under the control of sequencer 204 in order for digital video processor 110 to perform its processing functions within video processing system 100. The instructions of microcode RAM 208 are applied to microcode processor 218 by way of instruction bus 216. Microcode processor 218 of digital video processor 110 includes arithmetic logic unit 224, register file 228, barrel shifter 232 and several counters 236.

Arithmetic logic unit 224 of microcode processor 218 performs sixteen bit arithmetic and logic operations. Arithmetic logic unit 224 may also operate as two independent eight bit arithmetic logic units to provide a dual-add-with-saturate function. The two operands of arithmetic logic unit 224 come either from values held in input latches within arithmetic logic unit 224 or from eavesdropping on A bus 202 or B bus 206 of video processor 110. The result of any operations performed by arithmetic logic unit 224 is latched in an arithmetic logic unit output register. In a subsequent instruction, the result in this output register may be transferred to A bus 202, B bus 206 or other destinations.

Using the microcode routines in RAM 208, microcode processor 218 may read and write an arithmetic logic unit condition flag register. This may be used to save and restore the state of the flags in the flag register. The dual-add-with-saturate function of arithmetic logic unit 224 performs independent eight-bit additions on the upper and lower bytes of two arithmetic logic unit operands, A and B. The two bytes of the A operand are treated as unsigned binary numbers. The two bytes of the B operand are treated as offset binary numbers with an offset of one hundred twenty-eight. The upper and lower byte results are treated as nine bit offset binary, including the carry output of each byte, with an offset of one hundred twenty-eight and are saturated to a range of zero to two hundred fifty-five. This operation is symmetric. Either the A operand or the B operand may be defined as the unsigned binary value, and the other operand may be treated as the offset signed binary value.

Arithmetic logic unit 224 of microcode processor 218 is also provided with a dual-subtract-with-saturate function. The dual-subtract-with-saturate function is similar to the dual-add-with-saturate function as previously described. It calculates A−B+128 on each eight bit half of the two sixteen bit inputs and clamps the results to a value between zero and two hundred fifty-five. This may be viewed as subtracting an offset binary signed byte, between negative one hundred twenty-eight and one hundred twenty-seven, from an unsigned byte, between zero and two hundred fifty-five.

Within register file 228 of microcode processor 218, there are sixteen general purpose data registers. Each general purpose register is sixteen bits wide and is connected to both A bus 202 and B bus 206. These general purpose data registers are designated r0-r15 both when they are used as sources and when they are used as destinations within video processor 110. All registers r0-r15 are functionally identical except register r0. Register r0 of register file 228 also includes logic for bit shifting and byte swapping.

Registers r0-r15 of register file 228 may source both A bus 202 and B bus 206 of digital video processor 110 in the same instruction cycle. Registers r0-r15 cannot be the destination of both A bus 202 and B bus 206 in a single instruction cycle. Because registers r0-r15 are double latched, the same register r0-r15 may serve as both a source register and a destination register in the same instruction cycle of microcode processor 218. The result is that the data in a register r0-r15 prior to a current instruction cycle is driven onto a selected source bus 202, 206. The data applied to the destination bus 202, 206 may then be latched into the designated register r0-r15 at the end of the cycle.

As previously described data register r0 within register file 228 has additional logic to allow bit shifting and byte swapping. When bit shifting is performed in register r0 the value in register r0 may be shifted left or right one bit position per instruction cycle of microcode processor 218. Byte swapping in register r0 causes the most significant eight bit byte and the least significant eight bit byte of a sixteen bit value being loaded into register r0 to be interchanged.

Referring now to FIGS. 3A-D, there are shown data alignment diagram 300 and data alignment devices 320, 370, 380. Data alignment diagram 300 illustrates the byte swapping used to provide correct alignment of data within integrated video processing system 100. Data alignment devices 320, 370, 380 are alternative embodiments of a system for performing the byte swapping of data alignment diagram 300. Data alignment devices 320, 370 perform the byte swapping of data alignment diagram 300 in one direction and data alignment device 380 performs it in two directions. In the preferred embodiment of integrated video processing system 100 this byte swapping takes place in swap block 122 of host interface registers 122.

It will be understood that host interface registers 122 of video processing system 100 operates only upon a fixed thirty-two bit boundary when interfacing video processing system 100 with a host computer 150 or with host computer VRAM. This is true regardless of whether an input/output base address accessed by video processing system 100 is sixteen bit aligned or thirty-two bit aligned. Thus (1) data which is written to video processing system 100 by host computer 150, (2) byte-enables which are applied to video processing system 100, and (3) data which is read from video processing system 100, may require byte swapping as represented in data alignment diagram 300.

In data alignment diagram 300 high order data bytes 304, 306 of input data word 302 are swapped with low order data bytes 308, 310 within swap block 124 in order to form realigned data word 312. Within realigned data word 312 high order data bytes 308, 310 retain the same alignment with respect to each other that they had within input data word 302 prior to byte swapping. Likewise low order data bytes 304, 306 of realigned data word 312 retain the same alignment with respect to each other that they had within input data word 302 prior to byte swapping.

Data alignment device 320 is one embodiment of a system which may be provided within swap block 124 to perform the byte swapping operations of data alignment diagram 300. High order data bytes 304, 306 of input data word 302 are applied to data alignment multiplexer 322 of data alignment device 320 by way of multiplexer input line 324. Additionally, data alignment multiplexer 322 receives low order data bytes 308, 310 of input data word 302 by way of multiplexer input line 326. Output line 330 of data alignment multiplexer 322 provides output data byte1* 332 and output data byte0* 334 under the control of swap control line 328.

When a data swap is indicated by swap control line 328, output data byte1*, 332 receives byte 304 of input data word 302. In this manner high order data byte 304 of input data word 302, received by way of multiplexer input line 324, is selected and applied to byte1, 332 of realigned data word 360. Likewise, when swap control line 328 indicates a swap, output byte0* 334 of multiplexer output line 330 receives data byte 306 from input data word 302. Data byte 306 is received because multiplexer input line 324 is selected.

When swap control line 328 does not indicate that a swap should be performed data alignment multiplexer 322 selects data bytes 308, 310. Data bytes 308, 310 are thus received by way of multiplexer input line 326 and applied then to multiplexer output line 330. In this manner data byte 310 input data word 302 is applied to byte 334 of realigned data word 360 and data word 308 of input data word 302 is applied to data byte 332.

Data alignment multiplexer 342 of data alignment device 320 also receives high order data bytes 304, 306 of input data word 302 by way of multiplexer input line 324. Additionally, data alignment multiplexer 242 receives low order data bytes 308, 310 of input data word 302 by way of multiplexer input line 326. Output line 356 of data alignment multiplexer 342 provides output data byte3* 352 and output data byte2* 354 under the control of swap control line 328.

When a data swap is indicated by swap control line 328 output data byte3* 352 is set equal to byte 308 of input data word 302. In this manner data byte 308 of data word 302, received by way of multiplexer input line 324, is selected and applied to byte3* 352 of realigned data word 360. Likewise, when swap control line 328 indicates a swap output byte*2 354 of output line 356 receives data byte 310 from data word 302 because of multiplexer input line 324 is selected.

When swap control line 328 does not indicate that a swap should be performed within integrated video processing system 100, data alignment multiplexer 342 selects data bytes 304, 306 received by way of multiplexer input line 326. Multiplexer 342 applies selected data bytes 304, 306 to multiplexer output line 356. In this manner data byte 306 of input data word 302 is applied to byte 354 of realigned data word 360 and data word 308 is applied to data word 352. Data bytes 352, 354, 332, 334 of data alignment device 320 are combined to form output data word 360.

Data alignment device 370 provides schematic representation of a system for performing the byte swapping operations of data alignment diagram 300 as described with respect to data alignment device 320 using data selectors 321, 340. Thirty-two bit bus 331 of data alignment device 370, which transmits data word 302, may be split into sixteen bit bus 324 and sixteen bit bus 326 prior to being applied to data selectors 321, 340. Likewise, sixteen bit selector output buses 330, 350 may be joined to form bus 331 at the output of data selections 321, 340 in order to transmit data word 312. Furthermore, it will be understood that a plurality of data alignment devices 370 may be coupled to each other to provide the bidirectional implementation of data alignment device 380. The data bytes of a data word transmitted to one side of bidirectional data alignment device 380 by way of bidirectional thirty-two bit bus 384 may be applied to bus 382 at the other side of device 380 with their positions interchanged in the manner previously described with respect to data words 302, 312.

Returning now to a general description of microcode processor 218 of digital video processor 110, barrel shifter 232 of microcode processor 218 performs a single cycle n-bit left shift or a single cycle n-bit right shift of a designated number of bit positions. Barrel shifter 232 operates independently of arithmetic logic unit 224. There are three shift operations available within barrel shifter 232: (1) a right shift with sign extend, (2) a right shift with zero fill, and (3) a left shift with zero fill.

The shift operations of barrel shifter 232 are invoked by writing a four bit value representing the number of bit positions to be shifted to one of three A bus registers depending on which of the three shift operations is to be performed by barrel shifter 232. The operand is taken from B bus 206 and the result is stored in a barrel shifter output register. Like the arithmetic logic unit result register, the value in the barrel shifter output register may be read onto A bus 202 or B bus 206 in the following instruction cycle of microcode processor 218. An operation by barrel shifter 232 does not change any of the condition flags within microcode processor 218 of digital video processor 110.

Within counter block 236 of microcode processor 218 two sixteen bit loop counters are available. These two loop counters are directed to microcode programs within microcode RAM 208 for automatically counting iterations of a microcode loop being executed by microcode processor 218. In parallel with other operations performed in an instruction a loop counter may be decremented and a conditional branch may be made based upon the loop counter. Because the two loop counters may be written and read on A bus 202, they may also be used for variable storage when they are not used as loop counters. The loop counters of counter block 236 may be written to and decremented during the same instruction cycle. The value in the counter at the start of the next cycle is the value written to the counter minus one.

Data RAM 212 of digital video processor 110 holds five hundred twelve sixteen bit words that are accessed using four pointers. To access a value in a particular location of data RAM 212, a microcode routine in microcode RAM 208 first loads a pointer with the address to be accessed. The routine then performs a read or write using the same pointer. In parallel with the access of data RAM 212, the pointer may optionally be post-incremented or post-decremented. The four pointers may be written and read via A bus 202. All four pointers may be used to read or write data RAM 212 from either A bus 202 or B bus 206. Only one access of data RAM 212 may be performed during a single instruction cycle of digital video processor 110.

Microcode processor 218 within digital video processor 110 executes instructions stored in microcode RAM 208 under the control of sequencer 204 as previously described. Microcode RAM 208 holds five hundred twelve instructions wherein each instruction is forty-eight bits wide. In order to start microcode processor 218 host computer 150 coupled to integrated video processing system 100 by way of host bus interface 104 loads a microcode program into microcode RAM 208, points the program counter to the start of the program, and releases the HALT bit of video processor 110. Microcode processor 218 may also load its own microcode RAM 208 to overlay new routines. Therefore, video processor 110 does not require intervention by host computer 150 to perform multiple operations.

Host computer 150 may also read microcode RAM 208 by way of host bus interface 104. In order to perform this read, host computer 150 first loads the program counter with the address of the instruction to be read and then reads the three sixteen bit words of the instruction from the code registers. Normally, this is done by host computer 150 while digital video processor 110 is halted. Since the code registers hold the instruction to be executed as indicated by the program counter reading these three registers from a microcode routine is not useful.

There are three read registers in digital video processor 110. These three registers contain the next instruction to be read by microcode processor 118. There are also three write registers within digital video processor 110. The next instruction to be executed which is stored in the read registers is held in an instruction latch. The write registers of digital video processor 110 hold an instruction that is about to be written into microcode RAM 208 of microcode processor 218.

Digital video processor 110 is provided with two input channels 220 or input FIFOs 220 through which microcode processor 218 may read pixels or data from external VRAM. Each input channel 220 automatically fetches sixty-four bit quad words from external VRAM and breaks the fetched words into eight bit bytes or into sixteen bit words that are read by microcode processor 218. Input channels 220 operate independently of each other and they may be independently programmed to automatically increment or decrement through bytes or words in external VRAM. Input channels 220 are double buffered. Thus the next quad word may be prefetched by input channels 220 from external VRAM while values are extracted from a current word within video processor 110.

Within digital video processor 110 there are also two output channels 222 or output FIFOs 222 through which microcode processor 218 may write pixels or data to external VRAM. Each output channel 222 of video processor 110 automatically collects bytes or words into sixty-four bit quad words and writes the quad words to external VRAM. Output channels 222 operate independently of each other and may be programmed to write bytes or words into sequential addresses in external VRAM. The sequential addresses may be accessed either by incrementing or by decrementing. Output channels 222 are double buffered so that while one quad word is waiting to be written to external VRAM the next quad word may be assembled from individual bytes or words.

Statistical decoder 240 or Huffman decoder 240 of digital video processor 110 is a specialized input channel that reads a variable length bit sequence from external VRAM and converts it into a fixed length bit sequence that is read by microcode processor 218. Providing specialized input channel 240 to perform the operations required for Huffman decoding permits the processing power normally required of microcode processor 218 for statistical decoding to be put to other uses.

It is well known in the art that during image compression, as well as during other applications such as text compression, certain data values occur more frequently than others. A known technique of compressing this kind of data is using fewer bits to encode more frequently occurring data values and more bits to encode less frequently occurring values. This type of encoding results in a variable length sequence in which the length of a symbol used to encode a single data value may range, for example, from one bit to sixteen bits. It is statistically encoded data such as this that is decoded by statistical decoder 240 thereby permitting integrated video processing system 100 of the present invention to process these codes without using the time of microcode processor 218 for decoding.

The statistical code decoded by statistical decoder 240 of digital video processor 110 may be of the form shown in Table I. Each symbol of a predetermined length is formed of a run-in sequence, represented as ones in Table I, followed by some number of x bits which are separated from the run-in sequence by a zero. The series of ones in the run-in sequence may have a length of zero or more.

TABLE I

| |
|---|
| 0x |
| 10x |
| 110xxx |
| 1110xxxxx |
| ... |
| 11111110xxxxxx |
| 111111110xxxxxx |
| ... |

It will be understood that each x in the symbols of Table I may have a value of zero or one. Thus in the example of Table I, there are two symbols of length two as indicated in the first row: 00 and 01. The number of x bits following a run-in sequence may range from zero to six. When forming a statistical code for decoding by statistical decoder 240 it is desirable to have a few short codes and a larger number of long codes. Typically, codes with fewer run-in bits have a smaller number of x bits following the run-in sequence. However, this is not a hardware constraint. A code of this form is completely described by a code description table indicating the number R of ones in the run-in sequence and how many x bits follow the zero for each length of run-in sequence. The value of R is used as an index into the code description table. In the preferred embodiment of statistical decoder 240 the number actually stored in the table is $2^x$ where x is the number of x bits.

It will be understood that the series of ones may alternately be a series of zeros. The series of zeros may have a length of zero or more. The series of zeros followed by a one is shown in Table II. A bit in a control register within statistical decoder 240 determines the polarity of the run-in sequence bits.

TABLE II 1x
01x
001xxx
0001xxxxx
...
00000001xxxxxx
000000001xxxxxx

Within digital video processor 110 two enhancement scheme modes are supported by statistical decoder 240 with respect to this coding scheme. These two modes are referred to as the end mode and the short mode. If neither the end mode nor the short mode is enabled the decoding is performed by statistical decoder 240 as previously described. The short mode of statistical decoder 240 allows decoder 240 to be switched easily to a simpler code format without reloading the code description table. In the short form, all statistical symbols processed by integrated system 100 have the same number of x bits, as though all entries in the table had been filled with the same value of $2^x$. When the short mode is invoked this value of $2^x$ is obtained from a field in a control word assigned to control statistical decoder 240 rather than from the individual table entries.

The end mode is provided in statistical decoder 240 within integrated system 100 due to the fact that, for codes with few symbols, some increase in efficiency is possible by not placing a zero at the end of the longest run-in sequence. For example, consider the code set forth in Table III. The end mode permits the last symbol of Table III to be shortened to 11x rather than 110x. The trailing zero of the third row of Table III is not required because decoder has been told that the maximum length of a run-in is two ones.

TABLE III 0
10x
110x

Statistical decoder 240 decodes data at a rate of one bit per T-cycle of digital video processor 110. To a first approximation the decode time for an N-bit symbol is: decode time in T-cycles=N+1. At least sixty-four T-cycles are required for statistical decoder 240 to decode data from one quad word. This is the time required for eight quad word reads from the external VRAM. Thus statistical decoder 240 rarely runs out of data during operation of digital video processor 110.

Statistical decoder 240 begins reading a data value of an input bit stream from the least significant bit of the double word found at the starting location in the external VRAM. Thus statistical decoder 240 does not start on a byte or word boundary in the manner of input channels 220 or output channels 222. Statistical decoder 240 begins reading only on double word boundaries. The bit stream moves from the least significant bit to the most significant bit of a double word and then to the least significant bit of the next double word at the next higher address location. The first x bit read from the bit stream becomes the most significant bit of the x bit field when it is interpreted as a binary number.

Bilinear pixel interpolator 244 within digital video processor 110 performs bilinear interpolation upon four eight-bit interpolator input pixels. This may be used to provide an interpolator output pixel which is shifted by a fraction of a pixel position. If the four input pixels being interpolated have values of $P_A$, $P_B$, $P_C$, and $P_D$ and the horizontal weight and vertical weight of the interpolation are $w_h$ and $w_v$, respectively, the interpolated output value W, ignoring any quantization effects, may be given by:

$$W=P_A*(1-w_h)(1-w_v)+P_B*w_h(1-w_v)+P_C*(1-w_h)w_v+P_D*w_hw_v$$

Bilinear pixel interpolator 244 operates in two modes: the sequential two-dimensional mode and the random two-dimensional mode. The sequential two-dimensional mode of pixel interpolator 244 may be used for motion video decoding. Additionally, the sequential two-dimensional mode may be used when an array of pixels is interpolated with a common weighing. The random two-dimensional mode of pixel interpolator 244 may be used either when the pixels of the pixel array to be interpolated are not in two adjacent rows or when the interpolation weight is changed for each interpolation. The word random is thus understood to mean non-sequential.

The internal architecture of bilinear pixel interpolator 244 is pipelined. Thus pixel interpolator 244 requires a startup sequence of pixels to fill the pipeline. Once enough pixels have been supplied to fill the pipeline, pixel interpolator 244 generates a new interpolated pixel within digital video processor 110 every two T-cycles when operating in the sequential two-dimensional mode.

As previously described the random two-dimensional interpolation mode of pixel interpolator 244 is used either when the pixels to be interpolated are not in adjacent rows or when the interpolation weight is changed for each interpolated pixel. Examples of this are smooth warping and smooth scaling operations. In the case of the random interpolation the processing of successive interpolated pixels does not take advantage of the pipelined architecture of pixel interpolator 244. During operation of the random interpolation each pixel is considered to be the first pixel of a sequential mode interpolation.

In performing this two-dimensional interpolation within digital video processor 110 the interpolation weights and the two input pixel pairs are written into pixel interpolator 244. After waiting at least ten T-cycles the interpolated output pixel value may be read from pixel interpolator 244. It will be understood that the required delay is ten cycles when pixel interpolator 244 operates in the standard mode. However, the delay for obtaining an output pixel is only six T-cycles when pixel interpolator 244 operates in the fast mode. Bilinear pixel interpolator 244 may then receive the next two input pixel pairs and, if necessary, the new interpolation weight value.

Digital video processor 110 is provided with VRAM/host interface 252 coupled to both A bus 202 and B bus 206. Microcode processor 218 may write to display registers located within VRAM/host interface 252. These display registers are pitch values and pointers 248 that address display bitmaps in external VRAM. Pointers 248 of VRAM interface 252 are thirty-two bit values that specify the starting byte address of a bitmap or register load within a four gigabyte external memory address space. The internal representation of pointer 248 within interface 252 of video processor 110 is a thirty bit value. The pitch value associated with each pointer within VRAM interface 252 indicates the number of bytes between the start of two lines of a display bitmap or between the start of two register loads. The pitch is a single sixteen bit value with its two least significant bits ignored because the pitch must be an integer number of double words.

VRAM/host interface 252 also maintains pointers 248 to several functional blocks within digital video processor 110. The function blocks include input channels 220, output channels 222, statistical decoder 240, and various bitmaps. VRAM/host interface 252 is also effective to decode various codes transmitted to digital video processor 110 by way of bus 256. Other tasks performed by VRAM/host interface 252 include attending to generation of transfer cycles, scheduling refresh cycles and generating interrupt conditions for digital video processor 110.

Other functions of VRAM/host interface 252 within video processor 110 include arbitrating external VRAM accesses between input channels 220, output channels 222, statistical decoder 240, transfer request logic, VRAM refresh logic and the external VRAM access logic. During a memory cycle VRAM/host interface 252 performs appropriate address arithmetic on VRAM pointers 248 used for the memory cycle. VRAM/host interface 252 may perform a shadow copy in response to codes received by way of bus 256 which couples interface 252 to internal bus 130 of video processor 110. A shadow copy includes copying display related VRAM pointers 248 from a shadow register loaded by host computer 150 or by microcode processor 218 into working registers. When the pointer values are in the working registers they may be used for transfer cycles while the display screen is refreshed.

It will be understood that VRAM/host interface 252 serves as an interface with host computer 150 as well as an interface with VRAM 160. In its capacity as an interface with host computer 150 VRAM/host interface 252 provides the following functions. It arbitrates host computer 150 and digital video processor 110 access to external VRAM. It provides host computer 150 access to external devices. Additionally, VRAM/host interface 252 provides host computer 150 access to the internal registers and memories of digital video processor 110. As with the VRAM operations of VRAM/host interface 252, host computer 150 operations of interface 252 occur through a sequence of T-states.

Figure 4:
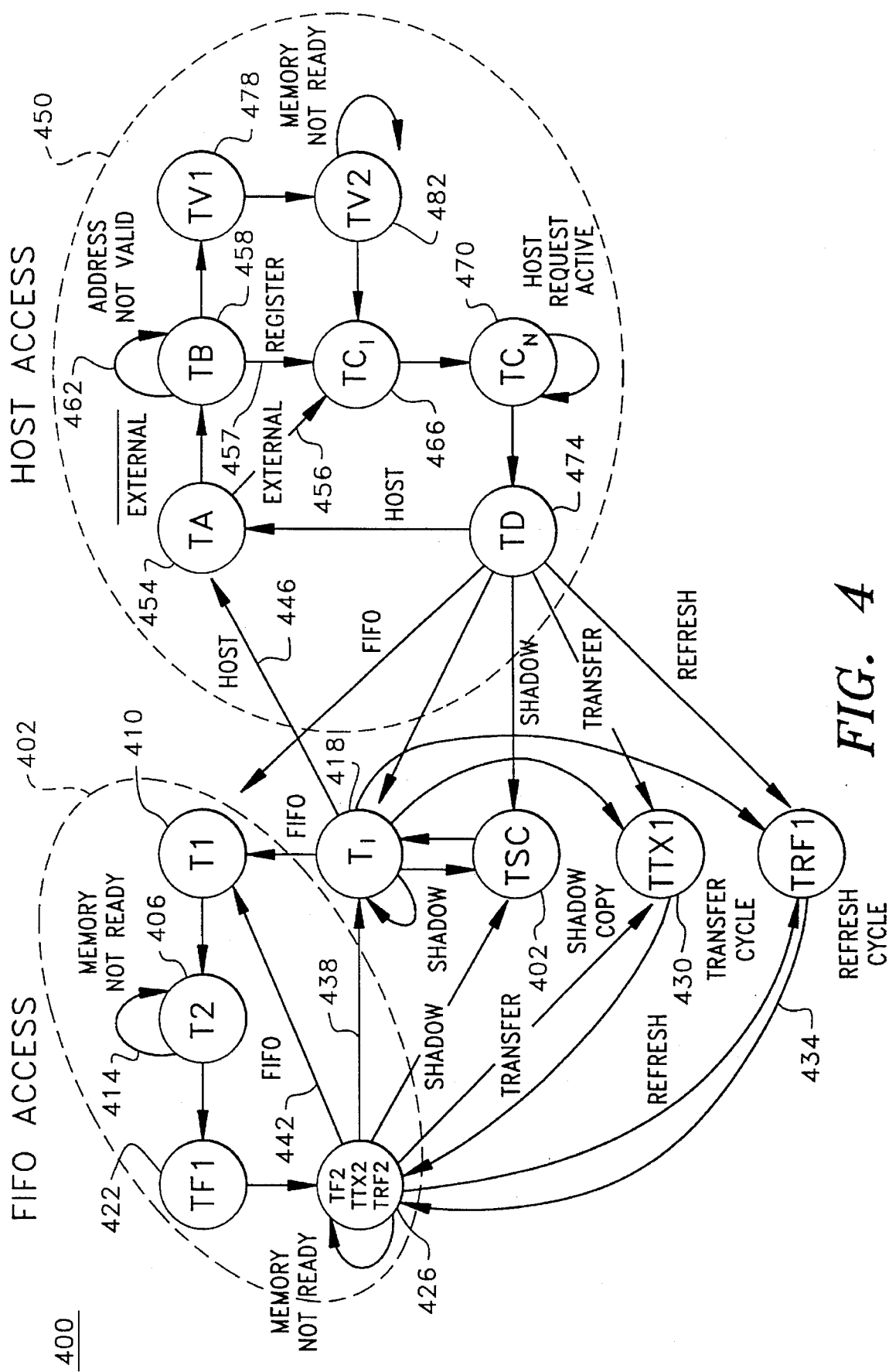
FIG. 4 shows an external access state diagram representation of the memory access operations of video processor of FIG. 2.

Referring now to FIG. 4, there is shown external access state diagram 400. External access state diagram 400 defines the VRAM/host computer 150 transactions with digital video processor 110 of integrated video system 100 which are controlled by VRAM/host computer 150 interface 252. Integrated video processing system 100, under the direction of digital video processor 110, may initiate five different types of memory accesses. The types of memory accesses are: (1) FIFO read, (2) FIFO write, (3) transfer read, (4) transfer write, and (5) memory refresh. The access states corresponding to these operations may be divided into FIFO access state subdiagram 402 and host access state subdiagram 450 of external access state diagram 400.

In addition, digital video processor 110 permits integrated system 100 to support VRAM accesses by external logic. During such an external access VRAM cycle video processor 110 tri-states its own buses and performs a host computer 150 VRAM read or host computer 150 VRAM write cycle. Other operations may be performed by digital video processor 110 in shadow copy state TSC 402. The operations are not VRAM cycles but they are arbitrated as though they are because no VRAM cycles may take place during shadow copy state TSC 402.

The types of VRAM cycles initiated by video processor 110, including host VRAM read and host VRAM write, begin with video processor 110 asserting a combination of its VRAM cycle definition outputs. External logic detects the state of these signals and produces the appropriate sequence of VRAM control signals to perform the type of memory cycle which video processor 110 has requested. Video processor 110 requires that each of these VRAM cycles take a minimum of two T-cycles T1 410, T2 406, or T-states 410, 406. The external logic may insert additional external access states T2 406 by way of idle loop 414 in order to stretch the VRAM cycle to more than two T-cycles.

At the beginning of a VRAM access digital video processor 110 may be in idle state Ti 418 of external access state diagram 400. As execution of FIFO cycles are performed FIFO external access states T1 410, T2 406, TF1 422 and TF2 426 are entered. These access states, as well as the relationships between them, are set forth in FIFO access subdiagram 402 of external access state diagram 400. As VRAM transfer cycles are performed external access states TTX1 430, TTX2 426 are entered. When VRAM refresh cycles are performed external access states TRF1 434, TRF2 436 are entered. When successive VRAM cycles are performed it is not necessary to return to idle state Ti 418 by way of path 438 between cycles. State TF2 426 may be followed directly by state T1 410 by way of path 442.

Within host access state subdiagram 450 of access state diagram 400 it may be seen that host access state TA 454 is the first state entered during a host transaction. Entry to host access state TA 454 from idle state Ti 418 is by way of path 446. When host computer 150 is granted bus access, access to a register within video processing system 100, or a VRAM transaction, the first cycle corresponds to access state TB 458. Execution may idle in host access state TB 458 by way of idle loop 462 until the required byte enable signals are provided. When valid output data is available, access state $TC_1$ 466 is entered. Completion of the current host cycle is then awaited in access states $TC_N$ 470. When the current host cycle is complete, the last host access state TD 474 is entered. Host access states TV1 478, TV2 482 are used for host VRAM transactions.

When digital video processor 110 performs data read or data write VRAM cycles by way of input channels 220 or output channels 222, it performs two thirty-two bit accesses in order to read or write one sixty-four bit value. These FIFO accesses are defined generally by FIFO access state subdiagram 402 within state machine access diagram 400. These two thirty-two bit accesses are always performed in a sequence beginning with an even address followed by the beginning address plus one. This guarantees that the two sequential accesses are in opposite banks of external VRAM. It also guarantees that the two sequential accesses are within the same VRAM page. This allows the external logic to use either bank-interleaving or a page-mode access to complete the second access of the sequence and thereby improve the VRAM bandwidth. However, it is not necessary for the second access be handled differently from the first. Both accesses are treated substantially as standard VRAM accesses. The external logic may treat the two accesses as two normal data read or data write cycles.

Each time a VRAM operation defined by external access state diagram 400 is complete and video processor 110 returns to its tristate, all pending VRAM acc, ss requests are examined and the highest priority request is selected for the next VRAM operation. The priority ordering of these requests within integrated video processing system 100, from highest to lowest, is: transfer cycle, shadow copy, host access, VRAM refresh, and FIFO read/write.

The VRAM refresh operation of video processing system 100 is placed low on the priority list to reduce the latency in servicing transfer requests and external VRAM requests. Since a single refresh code requires a number of refresh cycles, a higher priority for refresh may cause refresh cycles to occur in bursts that may lock out all lower priority requests until all refresh cycles completed. The following restriction is applied to all request types with higher priority than refresh within digital video processor 110 of integrated system 100: high priority requests, such as transfer cycles, shadow copies, and external VRAM access must occur infrequently enough to allow proper refresh of the external VRAM. Transfer cycles and shadow copies, by their nature, occur infrequently within integrated system 100 so they are usually not a problem.

There is a separate priority scheme for the five input/output channels previously described within digital video processor 110: two input channels 220, two output channels 222, and statistica decoder 240. The priority scheme used is a rotating priority scheme with an automatic override and single cycle arbitration. In the system of the present invention priority is assigned in a fixed cyclic order with the lowest priority thereby going to the input/output channel 220, 222, 240, that received the most recent access. This fixed cyclic order is: a first input channel 220, the second input channel 220, a first output channel 222, the second output channel 222, and finally, statistical decoder 240. There is only one level of memory in integrated video processing system 100 so the order in which requests arrive is not a factor in the arbitration.

In the automatic override the rotating cyclic priority may be bypassed if there is an urgent condition in one of the five input/output channels 220, 222, 240. A condition is urgent in a channel 220, 222, 240 if microcode processor 218 is idle because it is waiting for that channel to be ready. The urgent channel override may be either an input channel 220 that is empty or an output channel 222 that is full. In this case, the urgent channel gets the next available cycle. However, the priority given in an automatic override is still lower than the priority of a non-FIFO request, such as refresh cycles.

As previously described, VRAM interface 252 maintains VRAM pointers 248 for input channels 220, output channels 222 and statistical decoder 240, as well as display related pointers. Internally, each pointer 248 or address 248 is stored as a thirty-two bit value addressing a double word in external VRAM. In the preferred embodiment the values of pointers 248 are read and written as two sixteen bit words representing a thirty-two bit byte address. Thus with a thirty bit double word address, digital video processor 110 may decode a VRAM address space of one gigabyte of double words or four gigabytes. Using pointers 248 of VRAM interface 252 input channels 220 and output channels 222 may address a single word or byte in external VRAM.

Pointers 248 associated with statistical decoder 240 may be either post-incremented or post-decremented. In either case they may be adjusted in parallel with the VRAM read and write cycles of digital video processor 110. Statistical decoder 240 starts decoding bit streams only on double word boundaries in external VRAM and can only increment through VRAM. Pointers 248, located within VRAM/host interface 252 and used by statistical decoder 240, are post-incremented in parallel with each of the VRAM read cycles.

Further to the shadow copy operation of video processor 110 previously described, for example with regard to shadow copy state TSC 402 of external access state diagram 400, codes received by VRAM interface 252 by way of bus 256 may cause a shadow copy to be scheduled. The actual shadow copy operation occurs as soon as permitted by the priority scheme of video processor 110. Any VRAM access in progress at the time the codes are received must be completed. Additionally, any pending transfer cycle must be performed by video processor 110 before shadow copy state TSC 402 may begin.

During the copy operation shadow registers for various starting locations and various pitch values are copied into corresponding working registers within digital video processor 110. During display refresh the address arithmetic is performed on the working registers. The shadow registers may be loaded by host computer 150 or by a microcode routine operating in RAM 208 with less critical timing constraints. These registers are then copied by a shadow copy when it is time to update the registers, either prior to the next field or during the active display for split screen effects. This permits, for example, a simple interleaved or non-interleaved display to be refreshed with no intervention by host computer 150. For more complex displays, such as split screens, host computer 150 must update the shadow registers prior to each shadow copy. A shadow copy operation requires two T-cycles.

Further to the accessing of internal registers and memories of digital video processor 110 by host computer 150, host computer 150 may use the access in order to monitor and control the operation of microcode processor 218. Additionally, the access may be used to provide debugging of microprogram routines operating in microcode RAM 208 and to function as a test port for the purpose of production testing. After the host computer 150 has been granted bus access and access state TB 458 is entered, the address, the write enable, and the byte enables may be provided and external access state TC1 466 may be entered as previously described. In the case of a read of a register of digital video processor 110, access state TC1 466 of external access state diagram 400 is entered and the data bus is driven with the internal value. One cycle later, a transition to one of the N external access states $TC_N$ 470 occurs. This transition signals the presence of stabilized data. External access state $TC_N$ 470 is maintained until the completion of the cycle that caused a transition to external access state TD 474 within video processor 110.

In the case of a write to a register of video processor 110 by host computer 150, external access state TC1 466 is entered from external access state TB 458 by way of path 457. Under these circumstances the data bus may now be driven by host computer 150. Stable data at VRAM/host interface 252 as well as the completion of the write cycle are followed by transition to external access state TD 474 from a state $TC_N$ 470 wherein host computer 150 was active. Eventually, this is followed by a transition from external access state TD 474 of host access subdiagram 450.

Host computer 150 accesses to VRAM are also arbitrated and controlled by video processor 110 because video processor 110 is closely coupled with VRAM. Because the data bus is not driven until after a memory request, a transition into external access state TC1 466 to allow for data bus direction stabilization is not required. Instead, a transition to external access state TV1 478 occurs. This lasts for a single cycle and is followed by a transition to external access state TV2 482. State TV2 482 remains the current state until transition to state TD 474. In the case of a VRAM read, the memory data bus is driven during external access state TV1 478 and valid data appears in external access state TV2 482 as shown in external access state diagram 400. In the case of a VRAM write, the memory data bus is driven with valid data during external access state TV1 478.

In addition to host computer 150 access with respect to VRAM and the internal registers of digital video processor 110, an external device access mechanism is provided within video processor 110. In order to permit this access by an external device, digital video processor 110 releases the address, data, write enable, and byte enables in external access state TA 454. In this case external access state TC1 466 is directly entered from external access state TA 454 by way of path 456. Because video processor 110 ignores control of the data bus direction, host computer 150 and the external device may communicate unencumbered by digital video processor 110. Entry into external access state $TC_N$ 470 directly follows state TC1 466 in the expected sequence. This is followed by entry into external access state TD 474.

Figure 5:
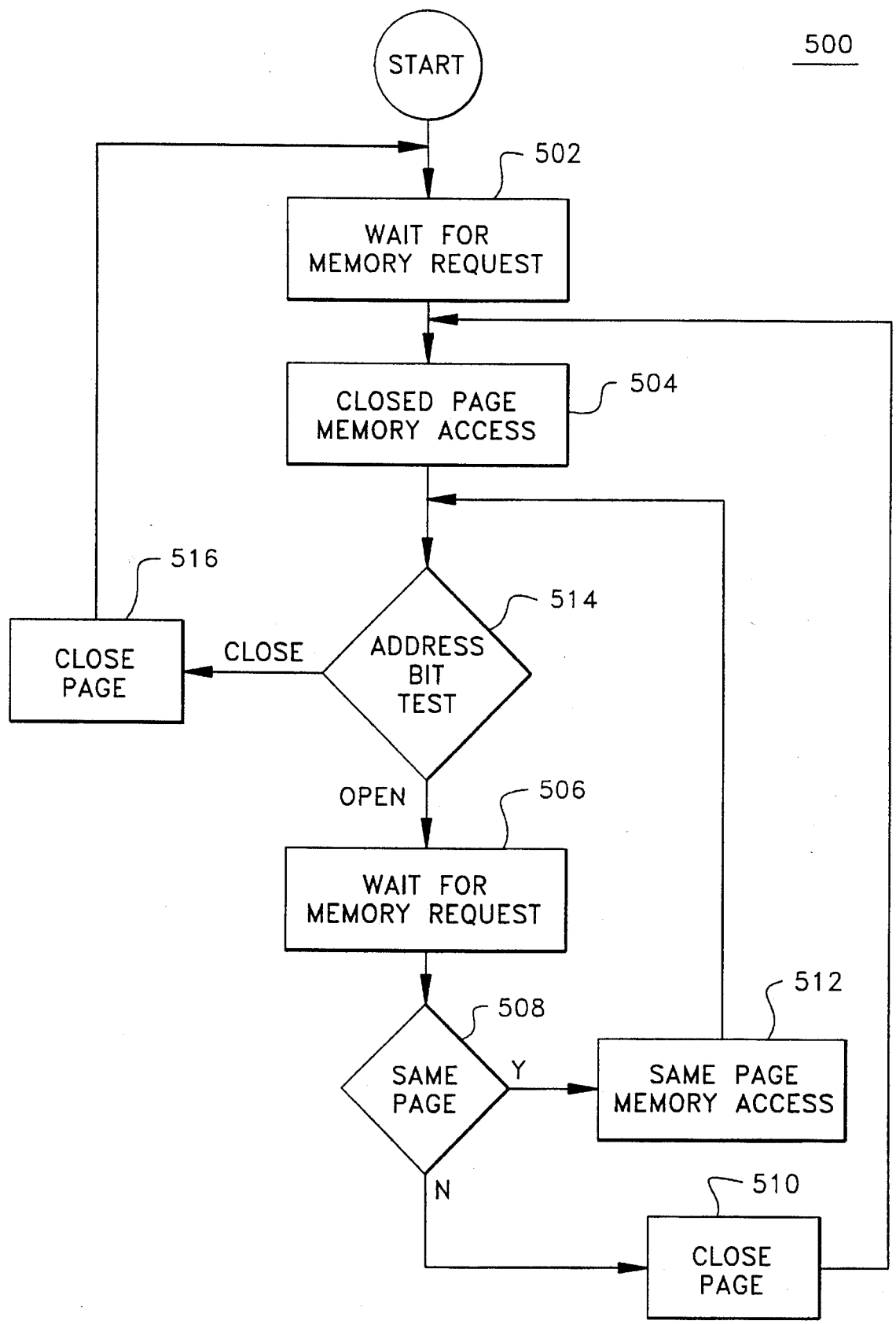
FIG. 5 shows a flow chart representation of a method for controlling the opening and closing of memory pages in the integrated video processing system of FIG. 1.

Referring now to FIG. 5, there is shown memory state flow diagram 500 which operates within integrated video processing system 100 in order to provide more efficient memory page accesses. It is well known to those skilled in the art that the access time $T_1$ for integrated video processing system 100 to obtain access to a page of external VRAM memory which is not open exceeds the access time $T_2$ required for access to the same page if the page is open. Furthermore, the access time $T_3$ required to access a different page of external VRAM memory when a current page is open is even longer. Thus, $T_3 > T_1 > T_2$.

Therefore, operation of integrated video processing system 100 may be more efficient if it is known whether the next access of digital video processor 110 is in the same page. This permits a determination to be made whether to close a current page of memory or leave it open. Within integrated video processing system 110 a page control signal is provided indicating this information. This page control signal may be transmitted by way of a high order address bit on thirty-two bit internal bus 130. The bit containing the page control information is detected by memory controller 128 within memory block 126. This high order address bit serves as a page control bit and thus allows video processing system 100 to determine whether to close a page after a memory access.

For example, in a software loop reading a large number of sequentially stored data words as part of a vector transfer it is known at the time the software is written that most of the accesses are in the same page of memory. In this case, it is more efficient to leave the page open after each access. Thus the high order address bit indicating whether to close the page may be adapted to signal that the page should be left open. The overhead wasted when these accesses cross a boundary from one page to another is quite small compared to the overhead saved by correctly leaving the page open after the remaining accesses.

In other cases it is known at the time the software is written that there are alternating references to different blocks of data when the software is executed. In these cases the high order address bit may be used to indicate that the pages should be closed after each access. When it is known whether the next access is likely to be to the same page or to a different page the programmer uses program instructions to inform the assembler. In response to these program instructions the assembler sets the page control bit. In this manner the software operating in digital video processor 110 communicates to the hardware of memory controller 128 whether to close a page of memory after the access.

Within memory state flow diagram 500, execution waits for a memory request in closed page idle block 502. The memory page which was used last is closed while idling in idle block 502. When a memory request is received memory state flow diagram 500 proceeds to closed page access block 504 for a memory access. Then memory access of access block 504 thus requires a memory page to be opened. After the memory access of access block 504 memory state flow diagram 500 proceeds to the address bit test of decision 514. In decision 514 a determination is made within memory controller 128 whether the next access to memory is likely to be in the same page or in a different page according to the software instructions of the programmer. In the preferred embodiment of integrated video processing system 100 this determination is made within memory controller 128 by hard-wired circuitry which determines the state of the predetermined high order address bit as previously described.

If a determination is made in decision 514 that the next access is likely to be to a different page of memory, the current page is closed in close page block 516 and memory state flow diagram 500 proceeds to idle block 502 to wait for the next memory request. If the next memory access is likely to be in the same page, as determined by decision 514, memory state flow diagram 500 proceeds to open page idle block 506. In idle block 506 the next memory request is awaited. The last page of memory which was accessed remains open while memory state flow 500 idles in open page idle block 506.

When the next memory request is received while idling in open page block 506, a determination is made in decision 508 whether the request is, in fact, for access to the same page as expected. If the requested access is not to the same page the current page is closed in block 510 and memory state flow diagram 500 proceeds to closed page memory access block 504. In memory access block 504 the requested page is opened and accessed as previously described.

If the memory request received while in open page idle block 506 is for access to the same page of memory, as determined in decision 508, memory state flow diagram 500 proceeds to same page access block 512. In access block 512 the requested open memory page is accessed. Execution of memory state flow 500 then proceeds to decision 514 for a determination by memory controller 128 whether the next access is likely to be in the same page according to the selected address bit.

It will be understood that there is a penalty paid for taking the path of memory state flow diagram 500 from decision 508 through closed page block 510 to closed page access block 504. However, that path is rarely taken if the programmer usually determines the likelihood of accessing the same page correctly. Because less time is required for the access of same page access block 512 than the access of closed page access block 504, the penalties for the occasional error in determining this likelihood are outweighed.

Figure 6A:
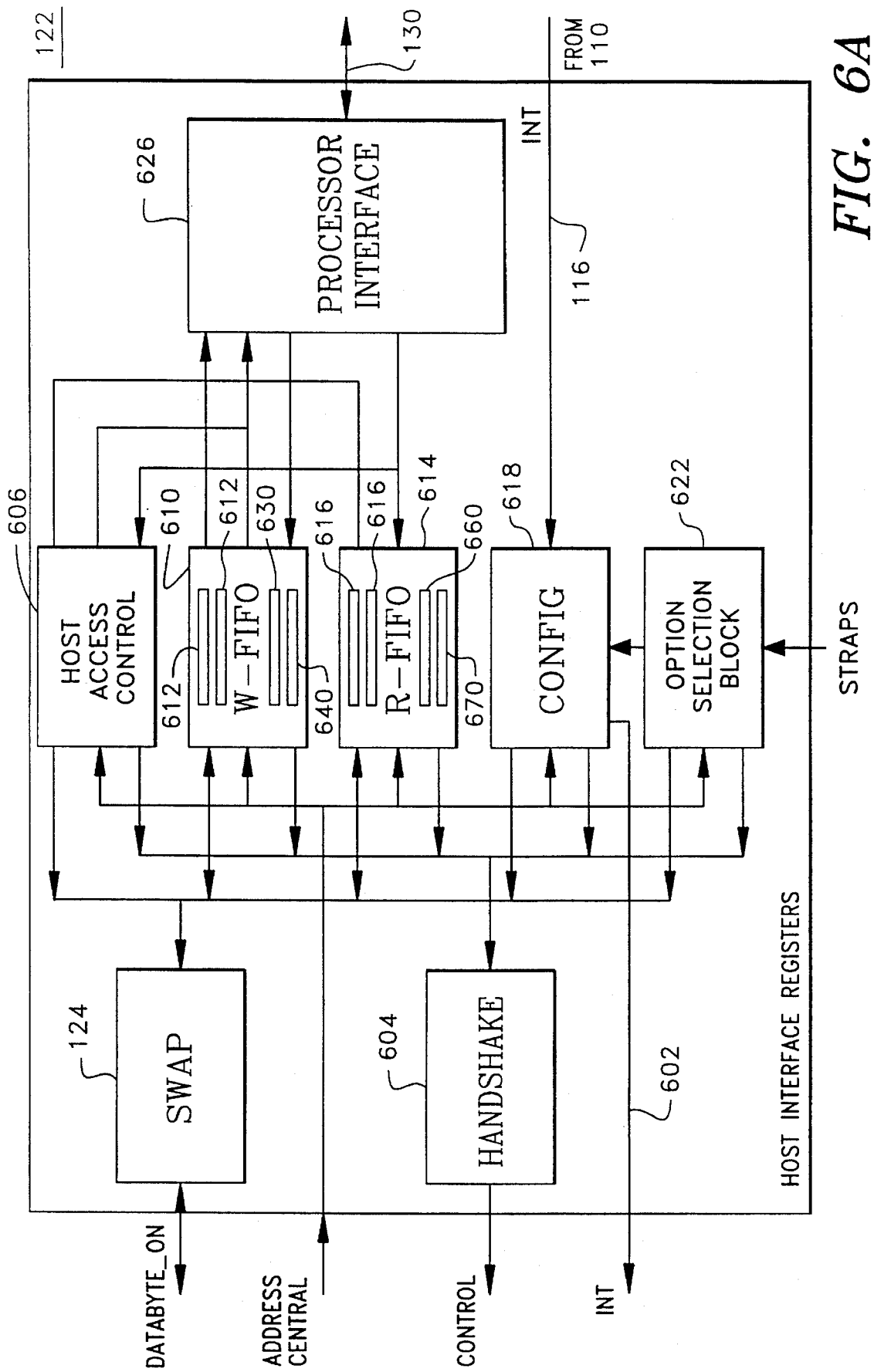
FIG. 6A shows a more detailed block diagram representation of the host interface registers of the integrated video processing system of FIG. 1.
Figure 6B:
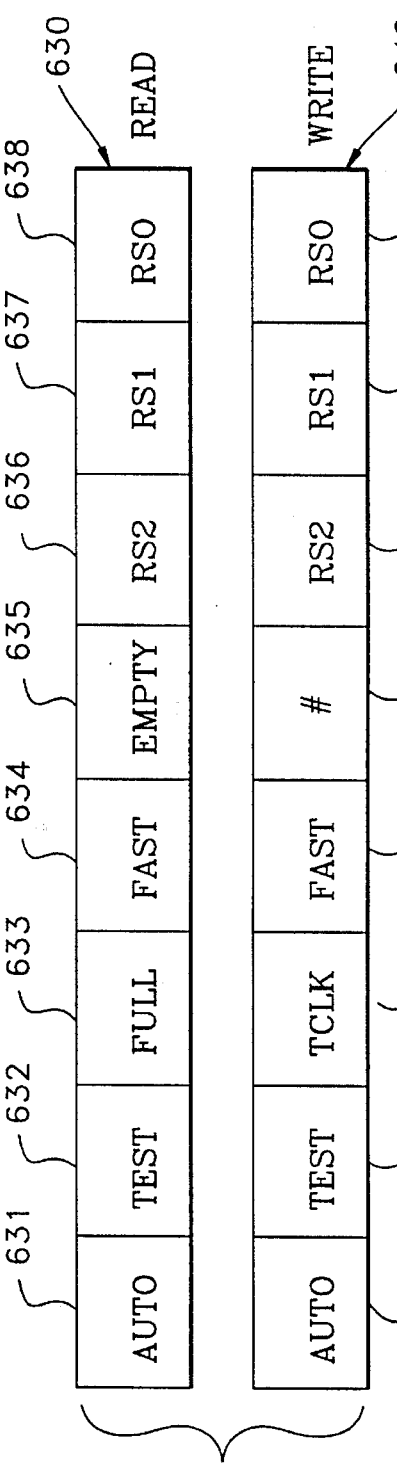
FIGS. 6B and 6C show the control registers of the host interface registers of FIG. 6A.
Figure 6C:
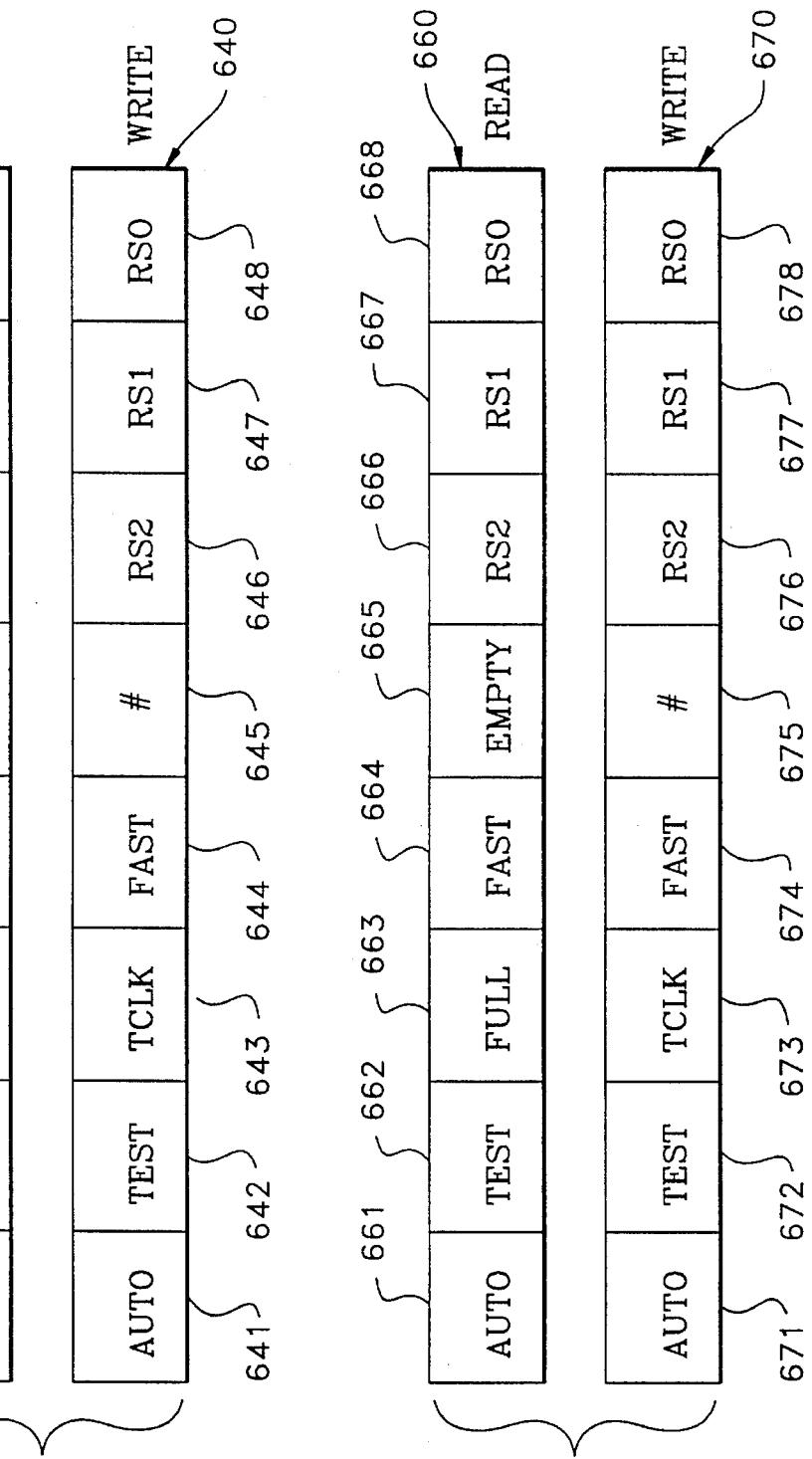

Referring now to FIGS. 6A–C, there are shown host interface registers 122 including FIFOs 610, 614 and their control registers 630, 640, 660, 670 for controlling the operations of host interface registers 122. Host interface registers 122 interfaces integrated video processing system 100 to host computer 150 as previously described. Within host interface registers 122 registers 630, 640, 660, 670 include read control register 630 and write control register 640 of write FIFO 610, as well as read control register 660 and write control register 670 of read FIFO 614.

Handshake control block 604 of host interface registers 122 controls handshaking between host interface registers 122 and host bus interface 104. Thus, video processor 110, coupled to host interface registers 122 by way of internal bus 130, may have access to external host computer 150 according to handshake control block 604. Host computer 150 may obtain access to memory 126 of integrated video processing system 100 by way of host interface registers 122 under the control of host computer 150 access control 606.

Write FIFO 610 of host interface registers 122 is a thirty-two bit high performance path from host computer 150 to memory 126 of video processing system 110. FIFO 610 contains two thirty-two bit double word buffers 612 designed to maximize the throughput of host computer bus 140 and internal bus 130. FIFO 610 attempts writing the first double word of data in buffers 612 as soon as it is collected from eight or sixteen bit input/output operations with host computer 150. During the time in which FIFO 610 attempts to obtain access to internal bus 130, host computer 150 may write additional bytes to FIFO 610. If FIFO 610 becomes full before the first access is granted and an address in memory 126 is an even double word address, then the access turns into a fast bus cycle. The fast bus cycle of video processing system 110 allows FIFO 610 to write both double words in the same cycle of internal bus 130. This action causes FIFO 610 to become more efficient when internal bus 130 gets busier.

Thirty-two bit write FIFO 610 dumps its data registers into memory 126 whenever the most significant byte of the most significant word in the data registers is written. Accessing write FIFO 610 when full causes wait states to be inserted until FIFO 610 is no longer full. Write FIFO 610 is provided with a flush command which empties the updated bytes in FIFO 610 into memory 126. Thus, a user of host interface registers 122 should wait until FIFO 610 is empty before accessing FIFO 610 after executing a flush command.

The operation of write FIFO 610 may be modified and controlled through programming of control registers 630, 640 within write FIFO 610. Auto bit 631 of read control register 630 when set to a one causes an address counter within FIFO 610 to increment by four after each write data cycle of internal bus 130. If the access is converted into a fast bus cycle, the address appears to increment by eight, even though in fact it has incremented by four twice. This does not matter except under unusual circumstances such as in a diagnostic program, where it may be possible for the software to catch the intermediate value. Write FIFO 610 of host interface registers 122 also accesses the same location repeatedly if not in the AUTO mode.

Test bit 632 of read control register 630 is used for diagnostics of FIFO 610. Setting test bit 632 prevents bus acquisition logic from requesting internal bus 130. This permits all registers within FIFO 610 to be accessed by video processor 610 without triggering a write cycle. For diagnostic purposes, test bit 632 of read control register 630 may stay set through several register reads and writes.

Full bit 633 of read control register 630 indicates the status of eight data holding registers that are provided within FIFO 610. If full bit 633 is one and data is written to the data ports the access becomes a slow access. In this case host computer 150 wait states are inserted until the writers completed. Full bit 633 is a one when at least the most significant byte of the first word is valid and all of the bytes of the second word are valid. Because FIFO 610 requests access to internal bus 130 when at least the most significant byte of the first word is valid, it is entirely possible in normal operation that FIFO 610 may never be full.

Fast bit 634 allows write FIFO 610 to perform the fast memory cycles previously described when FIFO 610 is full and the address counter of FIFO 610 points to an even double word of memory space. The fast memory cycle of video processing system 100 permits write FIFO 610 to deposit two thirty-two bit words in one cycle of internal bus 130. This ability saves the overhead for arbitration and the overhead for transfer of control which would have been required for processing the second thirty-two bit word. Empty bit 635 of read control register 630 indicates the status of various data holding registers within write FIFO 610. If all of the data holding registers are empty status bit 635 is set.

Tclk bit 643 of write control register 640 of write FIFO 610 is used for diagnostics. This bit is therefore left as a zero during normal operation of write FIFO 610. If Tclk bit 643 is one the address of FIFO 610 is not incremented when FIFO 610 is in AUTO mode. If Tclk bit 643 makes a transition from one to zero, the address counter is incremented by four. Reserved bit 645 should always be written with zero. However, the actual value of reserved bit 645 is ignored. Bits 646–648 of write control register 640 act cooperatively as a field for selecting other registers within write FIFO 610. Auto bit 641, test bit 642 fast bit 643 and bits 646–648 of write control register 640 operate substantially as described with respect to auto bit 631, test bit 632, fast bit 633 and bits 636–638 of read control register 630.

Read FIFO 614 of host interface registers 122 is a thirty-two bit high-performance path from memory 126 of integrated video processing system 100 to host computer 150. FIFO 614 contains two thirty-two bit double word buffers 616 designed to maximize the throughput of host computer 150 bus and internal bus 130. FIFO 614 attempts reading the first two double words of data as soon as the address counter of FIFO 614 is written. This occurs only in the AUTO mode. If FIFO 614 is empty and the address counter of FIFO 614 is pointing to an even double word address the access is a fast memory cycle. The fast memory cycle allows FIFO 614 to read both double words in the same cycle of internal bus 130. If a fast memory cycle is not possible FIFO 614 requires two cycles to fill data buffers 616. Host computer 150 then reads all eight bytes from read FIFO 614 without having additional wait states inserted. Accessing read FIFO 614 when empty causes wait states to be inserted until FIFO 614 has data.

While host computer 150 reads bytes or words from FIFO 614 with input/output reads, FIFO 614 attempts to read double words from memory 126 in order to keep FIFO 614 full. If FIFO 614 becomes empty and the address counter of FIFO 614 points to an even double word address the next access of internal bus 130 becomes a fast memory cycle. The fast memory cycle permits FIFO 614 to read both double words in the same cycle of internal bus 130. This action forces FIFO 614 to become more efficient as internal bus 130 gets busier.

The operation of read FIFO 614 may be controlled through programming of read control register 660 and write control register 670. Auto bit 661 of read register 660 when set to a one causes the address counter of FIFO 614 to increase by four after each read data cycle of internal bus 130. FIFO 614 does not prefetch data unless it is in the auto increment mode. Read FIFO 614 accesses the same thirty-two bit location repeatedly if not in the AUTO mode.

When host interface registers 122 is in AUTO mode, FIFO 614 brings prefetch data as soon as the high byte of the address counter is written. Furthermore, read FIFO 614 continues prefetching whenever FIFO 614 is not full. When host interface registers 122 are not in the AUTO mode, read FIFO 614 does not prefetch data when the high byte of the counter is written. Furthermore, FIFO 614 only fetches data when it is empty and host computer 150 makes an to access it.

Test bit 672 of read control register 660 and test bit 772 of write control register 670 are used for diagnostics of FIFO 614. In a manner similar to that described with respect to test bits 632, 642 of control registers 630, 640 of FIFO 610, setting test bits 642, 672 prevents bus acquisition logic from requesting internal bus 130 so that all registers may be accessed without triggering a read cycle. For diagnostic proposes, setting test bits 642, 672 does not interrupt a bus cycle already in process. If test bits 642, 672 are set accessing an empty FIFO 614 in a test mode causes the operation to return erroneous data. For diagnostic purposes, test bits 642, 672 may stay set through several register reads and writes.

Fast bits 664,674 of control registers 660, 670 allow read FIFO 614 to perform fast memory cycles when FIFO 614 is empty and the address counter of FIFO 614 points to an even double word. The fast memory cycle allows FIFO 614 to fetch two thirty-two bit words in one cycle of internal bus 130 as previously described. This avoids the overhead of arbitration and transfer of control for the second thirty-two bit word.

Empty bit 665 of read control register 660 indicates the status of the data holding registers in read FIFO 614. If empty bit 665 is one and data is read the access becomes a slow access wherein host computer 150 wait states are inserted until the write is completed. Empty is not necessarily the complement of full with respect to control registers 630, 660 of FIFOs 610, 614. In AUTO mode of interface registers 122, empty bits 635, 665 are normally only set for a short time after an address has been loaded in FIFOs 610, 614.

Tclk bit 673 of write control register 670 is used for diagnostics of read FIFO 614. Option selection block 622 of host interface registers 122 is used to format to make integrated video processing system 100 compatible with several different types of buses. The options controlled by host interface registers 122 include defining windows in memory space, enabling input operations and output operations in the window as well as memory access.

Referring now to FIGS. 7A–D, there are shown reconfigurable interrupt circuitry 700 of integrated video processing system 100 along with conventional tristate output circuit 760, conventional open drain output circuit 770 and conventional total pole output circuit 780.

Reconfigurable interrupt circuitry 700 is located in host interface registers 122. Reconfigurable interrupt circuitry 700 permits host interface registers 122 to receive a single type of interrupt signal from digital video processor 110 by way of interrupt line 116 and provide interrupt signals which may drive several different types of interrupt receiving circuits on other devices external to processing system 100. Interrupt circuitry 700 may provide interrupts suitable for interrupt receiving devices which are adapted to be driven by an open drain output circuit, a totem pole output circuit, a tristate output circuit, a non-tristate output circuit, an active high output circuit and an active low output circuit. Each of these different types of output circuits may be effectively imitated by reconfigurable interrupt circuitry 700 of the present invention within host interface registers 122.

Reconfigurable interrupt circuitry 700 is reconfigured in this manner under the control of active high/active low control line 714, open drain/totem pole control line 720, and tristate control line 730. Control lines 714,720, 730 of circuitry 700 may be determined by writing to interface registers 122 in integrated video processing system 100. These registers are in the address space of host computer 150.

An active low interrupt control signal from video processor 110 is applied to reconfigurable interrupt circuit 700 by way of interrupt input line 116. Interrupt input line 116 is applied to interrupt input gate 710. Also applied to interrupt input gate 710 is interrupt disable line 706. If interrupt disable line 706 is not low an interrupt signal on interrupt input line 116 can not be gated through input gate 710 and an interrupt output signal on interrupt output line 602 cannot be generated.

The gated interrupt signal at the output of gate 710 is gated along with active high/active low control line 714 by gate 716 thereby controlling the polarity of reconfigurable interrupt circuit 700. The output of polarity control gate 716 is applied to host computer 150 interrupt gate 724 by way of line 718. Additionally open drain/totem pole control line 720 is applied to host computer 150 interrupt gate 724 to provide the host computer 150 interrupt signal of line 726. The host computer 150 interrupt signal of line 726 is applied to output driver 748.

Output driver 748 is controlled by host computer 150 interrupt enable line 744. Host interrupt enable line 744, appearing at the output of interrupt enable gate 742, is determined by open drain/totem pole control line 720, tristate control line 730, and the output of polarity control gate 716 by way of enable gates 734, 738. In this manner the host computer 150 interrupt signal of line 726 is applied by output driver 748 to interrupt output line 602 in accordance with the host computer 150 interrupt enable signal of line 744.

The operation of reconfigurable interrupt circuitry 700 may be better understood in connection with Table IV. Table IV sets forth the state of interrupt output line 602 according to the interrupt signal of interrupt input line 116, and the state of control lines 714, 720, 730. The data of Table IV is valid when interrupt disable line 706 is low. Additionally, the state of lines 726, 744 are set forth in Table IV. It will be understood that the symbol T in the last column of Table IV indicates that output driver 748 of interrupt circuitry 700 is tristated for the corresponding states of input lines 116, 714, 720, 730.

TABLE IV

| Line No. | 116 | 714 | 730 | 720 | 726 | 744 | 602 |
| --- | --- | --- | --- | --- | --- | --- | --- |
| | 0 | 0 | 0 | 0 | 0 | 0 | T |
| | 0 | 0 | 0 | 1 | 0 | 0 | T |
| | 0 | 0 | 1 | 0 | 0 | 1 | 0 |
| | 0 | 0 | 1 | 1 | 0 | 1 | 0 |
| | 0 | 1 | 0 | 0 | 0 | 0 | T |
| | 0 | 1 | 0 | 1 | 1 | 0 | T |
| | 0 | 1 | 1 | 0 | 0 | 0 | T |
| | 1 | 1 | 1 | 1 | 1 | 1 | 1 |
| | 1 | 0 | 0 | 0 | 0 | 0 | T |
| | 1 | 0 | 0 | 1 | 1 | 0 | T |
| | 1 | 0 | 1 | 0 | 0 | 0 | T |
| | 1 | 0 | 1 | 1 | 1 | 1 | 1 |
| | 1 | 1 | 0 | 0 | 0 | 0 | T |
| | 1 | 1 | 0 | 1 | 0 | 0 | T |
| | 1 | 1 | 1 | 0 | 0 | 1 | 0 |
| | 1 | 1 | 1 | 1 | 0 | 1 | 0 |

The manner in which these characteristics of the output interrupt signal of interrupt output line 602 are obtained may be understood by modelling output driver 748 of interrupt circuitry 700 as output devices 760, 770, 780. The manner in which the output of devices 760, 770, 780 may provide the required values of Table VI is shown in Table V, which describes output device 760, Table IV which describes output device 770, and Table VII which describes output device 780. Tables V, VI, VII set forth the relationship between the inputs and outputs of output circuits 760, 770, 780.

TABLE V

| E 768 | D 762 | O 766 |
|---|---|---|
| 0 | 0 | Z |
| 0 | 1 | Z |
| 1 | 0 | L |
| 1 | 1 | H |

TABLE VI

| I 772 | O 776 |
|---|---|
| 0 | L |
| 1 | Z |

TABLE VII

| I 782 | O 784 |
|---|---|
| 0 | L |
| 1 | H |

In Tables V, VI, VII it will be understood that Z indicates a tristate output, L indicates a low output and H indicates a high output.

It will be understood that video processor 110 may provide multiple sources of interrupts. Therefore, interrupt sharing logic is required within integrated video processing system 100. The internal interrupt sharing logic provides the ability for software operating on video processor 100 to force input/output line 602 inactive and then allow it to go active if any interrupts are still pending. This causes a pulse, needed for edge-triggered interrupts, to occur if any interrupts are pending. For buses which use level triggered interrupts the interrupt may be shared with other devices.

Figure 8:
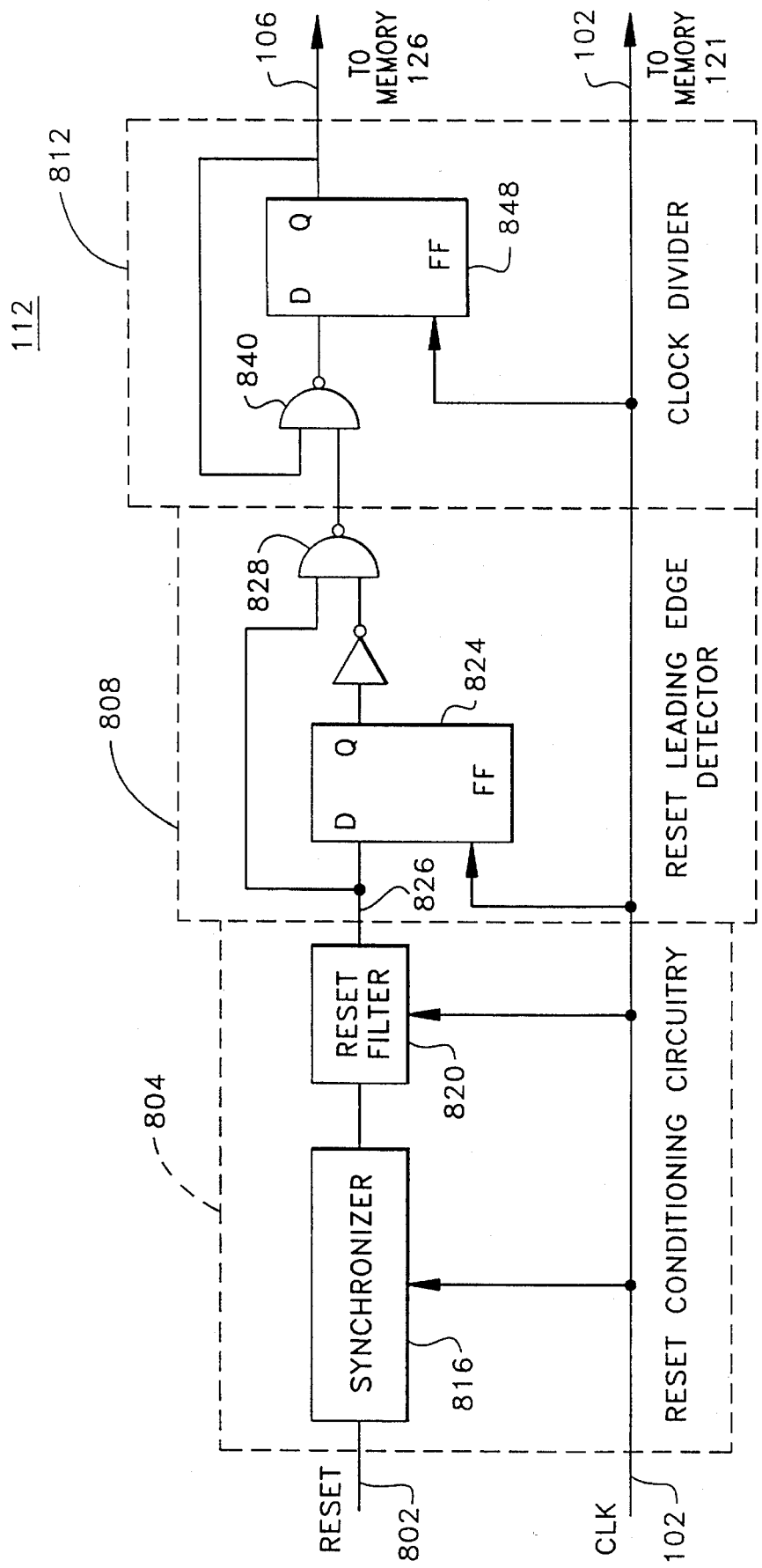
FIG. 8 shows a block diagram representation of a system for synchronizing the clocks of the integrated video processing system of FIG. 1.

Referring now to FIG. 8, there is shown clock synchronizing reset system 112 within system clock 114 of integrated video processing system 100. The reset state of video processing system 100 is entered by asserting a reset signal at the input of clock resynchronizing reset system 112 for at least ten T-cycles. In the rest state, or initial state, of video processing system 110 all bidirectional inputs and outputs are tri-stated. Additionally, the operation of microcode processor 218 of video processor 100 is halted, all interrupts are masked and the interrupt latches are cleared. During this time VRAM/host interface 252 is prepared to service VRAM requests but none of the VRAM pointers 248 of interface 252 are valid.

The reset signal received by clock synchronizing reset system 112 by way of reset input line 802 is applied to conventional reset conditioning circuitry 804. Reset conditioning circuitry 804 includes conventional synchronizer 816 and reset filter 820 as known to those skilled in the art. The conditioned reset signal is applied by reset conditioning circuitry 804 to reset leading edge detector 808 by way of line 826. The reset signal of line 826 is only applied to leading edge detector 808 when the reset signal of reset input line 802 is of a predetermined time duration because of the action of reset filter 820 of conditioning circuitry 804.

Within reset leading edge detector 808 the conditioned reset signal is applied to latch 824 which is clocked by clock input line 102. The clock signal of clock input line 102 is the externally available clock signal of integrated video processing system 100. This input clock signal is used to clock memory 126 of video processing system 100. Clock input line 102 also clocks reset conditioning circuitry 804. The output of latch 824 is inverted and applied to gate 828 which also receives the conditioned reset signal of line 826.

The output of gate 828 is thus representative of the leading edge of the reset signal of input line 102 and it is the output of reset leading edge detector 808. Thus, within reset leading edge detector 808 the active going edge of a reset signal is used to determine the phase of the divided clock. Edge detector 808 is effective to skip a cycle of the divided clock if necessary to force the predetermined phase upon the divided clock. The output signal of edge detector 808 is applied to clock divider 812.

Input gate 840 of clock divider 812 receives the output of reset leading edge detector 808 and gates it with the output of latch 848. Latch 848 is also clocked by the clock signal of clock input line 102 and provides at clock output line 106 a signal having a frequency equal to one-half of the frequency of the signal on clock line 106. This forces a predetermined phase upon the signal of clock output line 106 as distinguished from previous clock divider circuits which simply drive a divide-by-two latch circuit with the input clock without regard to the phase of the divided output. This clock signal of output line 106 is used within integrate video processing system 100 to clock circuitry other than memory 126 which may be operated at a higher frequency than the rest of integrated system 100.

Figure 9:
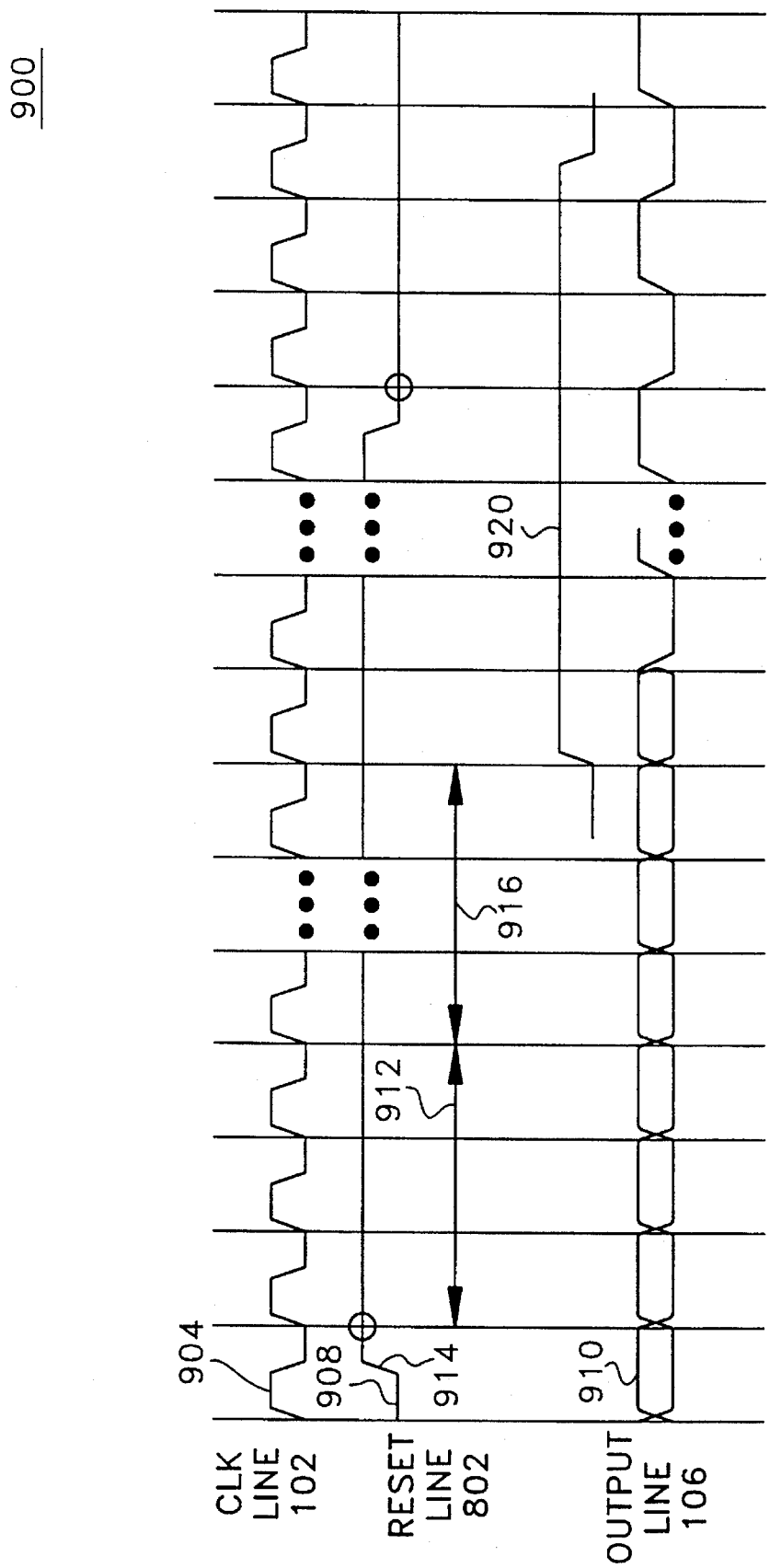
FIG. 9 shows a graphical representation of selected signals of the clock synchronizing system of FIG. 8.

Referring now to FIG. 9, there is shown timing diagram 900. Timing diagram 900 is representative of selected signals occurring within clock synchronizing reset system 112 around the time of a reset of integrated video processing system 100. Clock signal 904 of timing diagram 900 appears on clock line 102 of synchronizing reset system 112. Reset signal 908 of timing diagram 900 appears on reset input line 802. Clock out signal 910 appears on clock output line 106. When reset signal 908 goes high, as shown at time 914, time period 912 is required for propagation through synchronizer 816. Time period 912 has a duration of three clock cycles in the preferred embodiment of reset system 112. Time period 916 is then required for the operation of reset filter 820. The signal applied to leading edge reset detector 808 by reset conditioning circuitry 804 by way of line 826 is shown as signal 920 of timing diagram 900.

Figure 10:
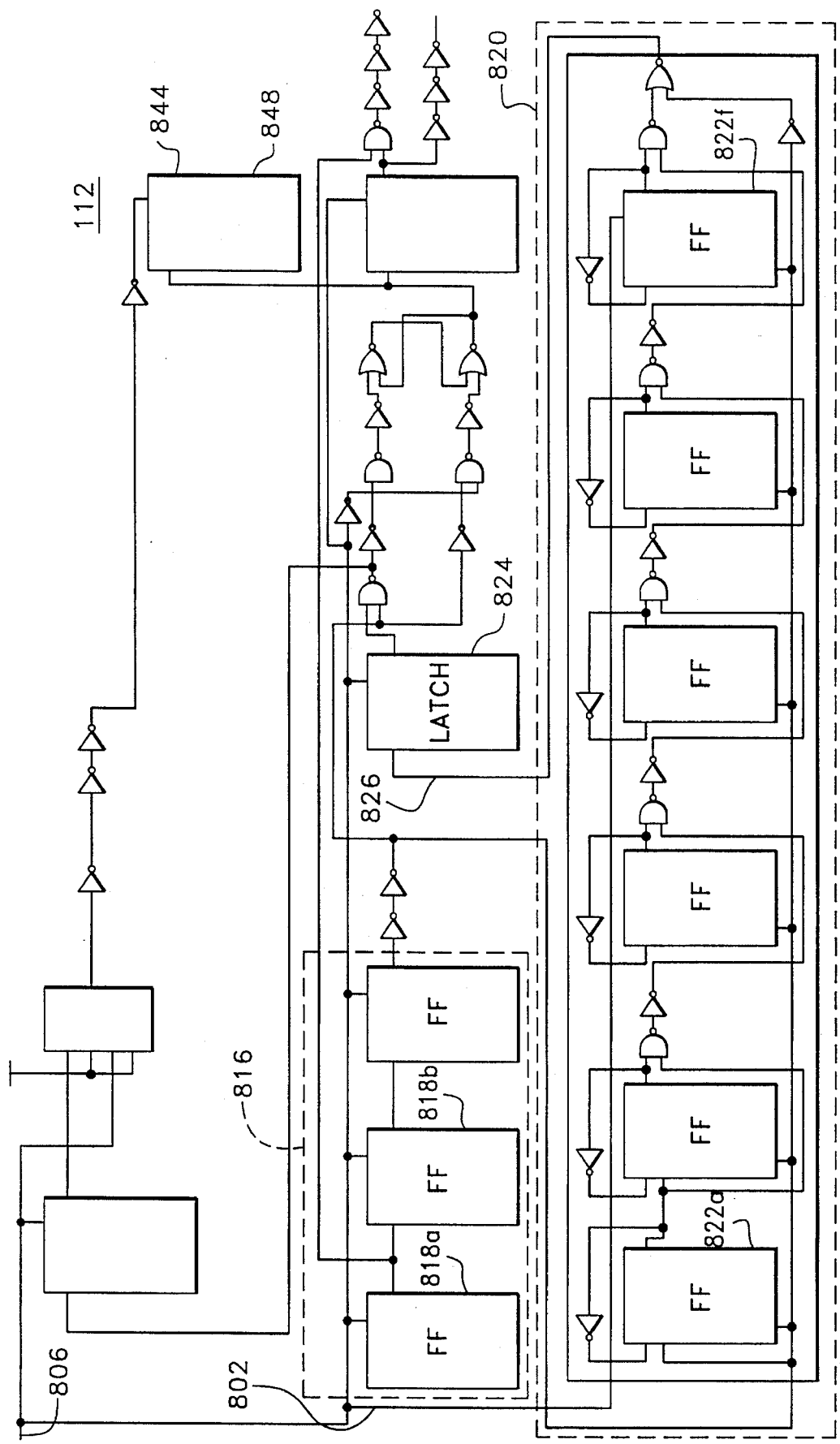
FIG. 10 shows a more detailed schematic representation of the clock synchronizing system of FIG. 8.

Referring now to FIG. 10, there is shown a more detailed schematic representation of clock synchronizing system 112. Synchronizer 816, which receives the reset signal of line 102, may include three flip flops 818a–c. It will be understood that it is the three flip flops 818a–c which account for the three cycle duration of time period 912 of timing diagram 900. The output of flip flops 818a–c of synchronizer 816 are applied to reset filter 820 as previously described. Reset filter 820 includes a six bit counter formed of six flip flops 822a–f. The output of reset filter 620 is applied to latch 824 of reset leading edge detector 808 by way of line 826 as also previously described.

Further to the architecture of digital video processor 110 of the present invention test signals are provided by digital video processor 110 for monitoring the performance of microcode within microcode processor 218. These test signals are available both as external signals multiplexed on a single output pin of integrated processing system 100. They are also internally available to digital video processor 110 as bits in the processor status register. One condition within video processor 110 which may be monitored using these signals is the freeze condition. A high level of the signal representing this condition may indicate that the microcode routine is not making the most efficient use of the buffering of input channels 220 and output channel 222. This is particularly important for the inner loops of graphics and video routines that are memory bandwidth limited. Ideally, inner loops should be balanced so that the rate at which pixels are processed is equal to the rate at which they may be read from and written to VRAM without freezes.

The buffering in input/output channels 220, 222 while microcode processor 218 executes microcode in RAM 208 serves to make sequential reads and writes to external VRAM more efficient. This execution is made more efficient by performing full sixty-four bit reads and writes, instead of individual eight-bit or sixteen-bit accesses. This has the effect of averaging the VRAM read/write rate over a number of instruction times. For example, when video processor 110 performs a sixty-four bit read or write every eight T-cycles, for an average of eight bits per T-cycle, a two instruction inner loop may read one eight-bit pixel and write one eight-bit pixel without any freezes occurring assuming that the source pixels and the destination pixels are sequential.

Another signal available within video processor 110 provides a useful performance monitoring capability by indicating when a particular segment of microcode within microcode RAM 208, bracketed by special instructions, is being executed by microcode processor 218. This allows either absolute execution time measurement or measurement of the fraction of the total execution time that is required by the bracketed segment of microcode.

An external input halt is provided for video processor 110 in order to allow external circuitry to immediately halt microcode processor 218. Applying a signal to this input pin causes microcode processor 218 to halt prior to executing the next instruction. When processor 218 is halted, VRAM interface 252 of system continues to operate normally, performing transfer cycles, refresh cycles, and shadow copies.

It will be understood that various changes in the embodiments which have been described and illustrated in order to explain the nature of this invention may be made by those skilled in the art without departing from the principle and scope of the invention as expressed in the following claims.

We claim:

1. A circuit for processing interrupt signals, comprising:
   (a) means for receiving art active low input interrupt signal;
   (b) means for receiving a plurality of control signals; and
   (c) means coupled to receiving means (a) and (b) for converting the active low input interrupt signal into an active high, active low, open drain, totem pole, or tristate output interrupt signal at an output in accordance with the plurality of control signals: wherein converting means (c) comprises
      (1) first, second, third, and fourth AND gates, each of said AND gates having first and second inputs;
      (2) first, second, third, and fourth INVERTERS;
      (3) an XOR gate having first and second inputs;
      (4) an OR gate having first and second inputs;
      (5) an output driver for providing an interrupt output signal to the output, the output driver having a first input and an interrupt enable input;
      (6) an input interrupt signal lined for receiving the active low input interrupt signal;
      (7) an interrupt disable line;
      (8) an active high/active low control signal line;
      (9) an open drain/totem pole control signal line; and
      (10) a tristate control signal line wherein the active high/active low control signal line open drain/totem pole control signal line, and tristate control signal line are for receiving the plurality of control signals; wherein:
         (i) the input interrupt signal line is connected to the input of the .first INVERTER;
         (ii) the interrupt disable line is connected to the input of the second INVERTER;
         (iii) the active high/active low control signal line is connected to the input of the third INVERTER;
         (iv) the open drain/totem pole control signal line is connected to the first input of the third AND gate and to the second input of the second AND gate;
         (v) the tristate control signal line is connected to the second input of the fourth AND gate and to the second input of the third AND gate;
         (vi) the output of the first INVERTER is connected to the first input of the first AND gate;
         (vii) the output of the second INVERTER is connected to the second input of the first AND gate;
         (viii) the output of the third INVERTER is connected to the second input of the XOR gate;
         (ix) the output of the first AND gate is connected to the first input of the XOR gate;
         (x) the output of the XOR gate is connected to the first input of the second AND gate and to the input of the fourth INVERTER;
         (xi) the output of the fourth INVERTER is connected to the first input of the fourth AND gate;
         (xii) the output of the third AND gate is connected to the first input of the OR gate;
         (xiii) the output of the fourth AND gate is connected to the second input of the OR gate;
         (xiv) the output of the OR gate is connected to the interrupt enable input of the output driver; and
         (xv) the output of the second AND gate is connected to the first input of the output driver.

2. The circuit of claim 1, further comprising:
   (d) means for receiving an interrupt disable signal comprising the interrupt disable line; and
   (e) means for disabling the converting means (c) in accordance with the interrupt disable signal comprising the second INVERTER.

3. The circuit of claim 1, wherein the plurality of control signals comprises an active high/active low control signal, an open drain/totem pole control signal, and a tristate control signal.

4. The circuit of claim 1, wherein:
   receiving means (b) is electrically connected to a memory device: and the memory device is electrically connected to a bus.

5. The circuit of claim 2, wherein:
   receiving means (b) is electrically connected to a memory device: and the memory device is electrically connected to a bus.

6. The circuit of claim 3, wherein:
   receiving means (b) is electrically connected to a memory device; and the memory device is electrically connected to a bus.

7. A method for processing interrupt signals, comprising the steps or:
   (a) receiving an active low input interrupt signal;
   (b) receiving a plurality of control signals; and
   (c) converting the active low input interrupt signal into an active high, active low, open drain, totem pole, or tristate output interrupt signal at an output in accordance with the plurality of control signals;
   wherein steps (a), (b), and (c) are performed with a circuit comprising:
      (1) first, second, third, and fourth AND gates, each of said AND gates having first and second inputs;
      (2) first, second, third, and fourth INVERTERS;

(3) an XOR gate having first and second inputs;
(4) an OR gate having first and second inputs;
(5) an output driver for providing an interrupt output signal to the output, the output driver having a first input and an interrupt enable input;
(6) an input interrupt signal line for receiving the active 10w input interrupt signal;
(7) an interrupt disable line;
(8) an active high/active low control signal line;
(9) an open drain/totem pole control signal line; and
(10) a tristate control signal line wherein the active high/active low control signal line, open drain/totem pole control signal line, and tristate control signal line are for receiving plurality of control signals; wherein:
  (i) the input interrupt signal line is connected to the input of the first INVERTER;
  (ii) the interrupt disable line is connected to the input of the second INVERTER;
  (iii) the active high/active low control signal line is connected to the input of the third INVERTER;
  (iv) the open drain/totem pole control signal line is connected to the first input of the third AND gate and to the second input of the second AND gate;
  (v) the tristate control signal line is connected to the second input of the fourth AND gate and to the second input of the third AND gate;
  (vi) the output of the first INVERTER is connected to the first input of the first AND gate;
  (vii) the output of the second INVERTER is connected to the second input of the first AND gate;
  (viii) the output of the third INVERTER is connected to the second input of the XOR gate;
  (ix) the output of the first AND gate is connected to the first input of the XOR gate;
  (x) the output of the XOR gate is connected to the first input of the second AND gate and to the input of the fourth INVERTER;
  (xi) the output of the fourth INVERTER is connected to the first input of the fourth AND gate;
  (xii) the output of the third AND gate is connected to the first input of the OR gate;
  (xiii) the output of the fourth AND gate is connected to the second input of the OR gate;
  (xiv) the output of the OR gate is connected to the interrupt enable input of the output driver; and
  (xv) the output of the second AND gate is connected to the first input of the output driver.

8. The method of claim 7, further comprising the steps of:
(d) receiving an interrupt disable signal on the interrupt disable line; and
(e) disabling with the second INVERTER the conversion of step (c) in accordance with the interrupt disable signal.

9. The method of claim 7, wherein the plurality of control signals comprises an active high/active low control signal, an open drain/totem pole control signal, and a tristate control signal.

10. A circuit for processing interrupt signals, comprising:
(a) first, second, third, and fourth AND gates, each of said AND gates having first and second inputs;
(b) first, second, third, and fourth INVERTERS:
(c) an XOR gate having first and second inputs;
(d) an OR gate having first and second inputs;
(e) an output driver for providing an interrupt output signal at an output, the output driver having a first input and an interrupt enable input;
(f) an input interrupt signal line for receiving an active low input interrupt signal;
(g) an interrupt disable line for receiving art interrupt disable signal;
(h) an active high/active low control signal line;
(i) an open drain/totem pole control signal line; and
(j) a tristate control signal line, wherein the active high/active low control signal line, open drain/totem pole control signal line, and tristate control signal line axe for plurality or control signal wherein:
  (1) the input interrupt signal line is connected to the input of the first INVERTER;
  (2) the interrupt disable line is connected to the input of the second INVERTER:
  (3) the active high/active low control signal line is connected to the input of the third INVERTER;
  (4) the open drain/totem pole control signal line is connected to the first input of the third AND gate and to the second input of the second AND gate;
  (5) the tristate control signal line is connected to the second input of the fourth AND gate and to the second input of the third AND gate;
  (6) the output of the first INVERTER is connected to the first input of the first AND gate;
  (7) the output of the second INVERTER is connected to the second input of the first AND gate;
  (8) the output of the third INVERTER is connected to the second input of the XOR gate;
  (9) the output of the first AND gate is connected to the first input of the XOR gate;
  (10) the output of the XOR gate is connected to the first input of the second AND gate and to the input of the fourth INVERTER;
  (11) the output of the fourth INVERTER is connected to the first input of the fourth AND gate;
  (12) the output of the third AND gate is connected to the first input of the 0R gate;
  (13) the output of the fourth AND gate is connected to the second input of the OR gate:
  (14) the output of the OR gate is connected to the interrupt enable input of the output driver; and
  (15) the output of the second AND gate is connected to the first input of the output driver.

11. The circuit of claim 10, wherein:
the input interrupt signal line is further connected to a video processor;
the interrupt disable line, the active high/active low control signal line, the open drain/totem pole control signal line, and the tristate control signal lines are connected to a memory device; and
the memory device and the video processor are electrically connected to a bus.

* * * * *

UNITED STATES PATENT AND TRADEMARK OFFICE
CERTIFICATE OF CORRECTION

PATENT NO. : 5,519,345            Page 1 of 2
DATED : May 21, 1996
INVENTOR(S) : Robert Farrell, Hamanshu Sanghavi and Ashish Pandya It is certified that error appears in the above-indentified patent and that said Letters Patent is hereby corrected as shown below:

Column 23, line 39, delete "art" and insert therefore --an--.

Column 23, line 56, delete "lined" and insert therefore --line--.

Column 23, line 62, insert --,-- after the word line.

Column 23, line 67, delete ".first" and insert therefore --first--.

Column 24, line 56, delete "or" and insert therefore --of--.

Column 25, line 7, delete "10w" and insert therefore --low--.

Column 25, line 11, insert --,-- after the word line.

Column 25, line 29, delete ":" and insert therefore --;--.

Column 26, line 1, delete ":" and insert therefore --;--.

Column 26, line 9, delete "art" and insert therefore --an--.

Column 26, line 16, delete "axe" and insert therefore --are--.

Column 26, line 17, insert --receiving a-- after the word for.

UNITED STATES PATENT AND TRADEMARK OFFICE
CERTIFICATE OF CORRECTION

PATENT NO. : 5,519,345
DATED : May 21, 1996
INVENTOR(S) : Robert Farrell, Hamanshu Sanghavi and Ashish Pandya It is certified that error appears in the above-indentified patent and that said Letters Patent is hereby corrected as shown below:

Column 26, line 17, delete "or" and insert therefore --of--.

Column 26, line 17, delete "signal" and insert therefore --signals;--.

Column 26, line 44, delete "OR" and insert therefore --OR--.

Signed and Sealed this

Eighteenth Day of February, 1997

Attest:

BRUCE LEHMAN

*Attesting Officer*       Commissioner of Patents and Trademarks